United States Patent
Curtis et al.

(10) Patent No.: US 7,363,334 B2
(45) Date of Patent: Apr. 22, 2008

(54) DIGITAL SIGNAL-PROCESSING STRUCTURE AND METHODOLOGY FEATURING ENGINE-INSTANTIATED, WAVE-DIGITAL-FILTER COMPONENTRY, AND FABRICATION THEREOF

(75) Inventors: Thomas E. Curtis, Weymouth (GB); Steven B. Sidman, Scarborough, ME (US)

(73) Assignee: Accoutic Processing Technology, Inc., Scarborough, ME (US)

( * ) Notice: Subject to any disclaimer, the term of this patent is extended or adjusted under 35 U.S.C. 154(b) by 797 days.

(21) Appl. No.: 10/651,233

(22) Filed: Aug. 28, 2003

(65) Prior Publication Data
US 2005/0050126 A1    Mar. 3, 2005

(51) Int. Cl.
*G06F 17/10* (2006.01)
(52) U.S. Cl. ...................... 708/317; 708/320
(58) Field of Classification Search ................ 708/317, 708/318, 320
See application file for complete search history.

(56) References Cited

U.S. PATENT DOCUMENTS

| | | | |
|---|---|---|---|
| 4,192,008 A | * | 3/1980 | Mandeville ................ 708/317 |
| 5,138,568 A | * | 8/1992 | Gazsi et al. ................ 708/306 |
| 5,203,335 A | | 4/1993 | Noujaim et al. |
| 5,436,872 A | | 7/1995 | Gilmour et al. |
| 5,461,389 A | | 10/1995 | Dean |
| 5,473,701 A | | 12/1995 | Cezanne et al. |
| 5,513,118 A | * | 4/1996 | Dey et al. ................ 716/18 |
| 5,530,660 A | | 6/1996 | Sun et al. |
| 5,581,620 A | | 12/1996 | Brandstein et al. |
| 5,737,431 A | | 4/1998 | Brandstein et al. |
| 5,793,875 A | | 8/1998 | Lehr et al. |
| 5,825,898 A | | 10/1998 | Marash |
| 5,835,390 A | | 11/1998 | Trager |
| 5,844,951 A | | 12/1998 | Proakis et al. |

(Continued)

FOREIGN PATENT DOCUMENTS

GB    2 205 946 A    12/1988

(Continued)

OTHER PUBLICATIONS

Sigma-Delta-Modulator http://www.lme.fh-muenchen.de/1st/sdamp/sd_mod_e.html, Jul. 2001.

(Continued)

*Primary Examiner*—Chuong D Ngo
(74) *Attorney, Agent, or Firm*—Jon M. Dickinson, PC; Robert D. Varitz, PC

(57) ABSTRACT

Digital signal-processing structure and methodology which feature a time-slice-based digital fabricating engine, and software operating structure operatively associated with that engine structured to operate the engine in a time-slice-based fabrication mode wherein the engine, in a time-differentiated and instantiating manner, functions to fabricate a time-succession of individual, composite wave digital filters. Each of these filters takes the form of (1) a concatenated assembly including one to a plurality of upstream, early-stage, decimate-by-two, signal-processing agencies connected in a cascade series arrangement, with each such agency possessing a first transfer function having a first transition bandwidth, and (2) a single, downstream, later-stage, decimate-by-two, signal-processing agency which possesses a second transfer function having a transition bandwidth which is less than the mentioned first transition bandwidth.

30 Claims, 14 Drawing Sheets

U.S. PATENT DOCUMENTS

| | | | |
|---|---|---|---|
| 5,854,756 | A | 12/1998 | Willink |
| 6,049,607 | A | 4/2000 | Marash et al. |
| 6,108,680 | A * | 8/2000 | Liu et al. .................... 708/317 |
| 6,178,248 | B1 | 1/2001 | Marash |
| 6,198,693 | B1 | 3/2001 | Marash |
| 6,204,789 | B1 | 3/2001 | Nagata |
| 6,226,090 | B1 | 5/2001 | Yoneyama |
| 6,249,581 | B1 | 6/2001 | Kok |
| 6,260,053 | B1 | 7/2001 | Maulik et al. |
| 6,285,306 | B1 | 9/2001 | Zrilic |

FOREIGN PATENT DOCUMENTS

| | | |
|---|---|---|
| WO | WO 98/47313 | 10/1998 |

OTHER PUBLICATIONS

High Performance Signal Acquisition Systems for Sonar Applications, T.E. Curtis et al ,Proc. I.O.A., vol. 11,part 8 (1989).

High Efficiency Wave translation Filters for Sonar Band Selection, Proceedings of the Institute of Acoustics (Proc.I.O.A. vol. 11 Part 8 1989).

An Alternative Implementation of the Superdirective Beamformer, Joerg Bitzer et al., IEEE, 1999.

Adaptive Speech Beamforming Using the TMS320C40 Multi-DSP, Wauters, et al. Dec. 1995.

Analog-to-Digital Converter Architectures and Choices for System Design, Brian Black, Analog Dialog vol. 33, No. 8, Sep. 1999.

Sigma Delta Tutorial (Without the Math, A Qualitative Discussion, James M. Bryant, Jan. 2001).

* cited by examiner

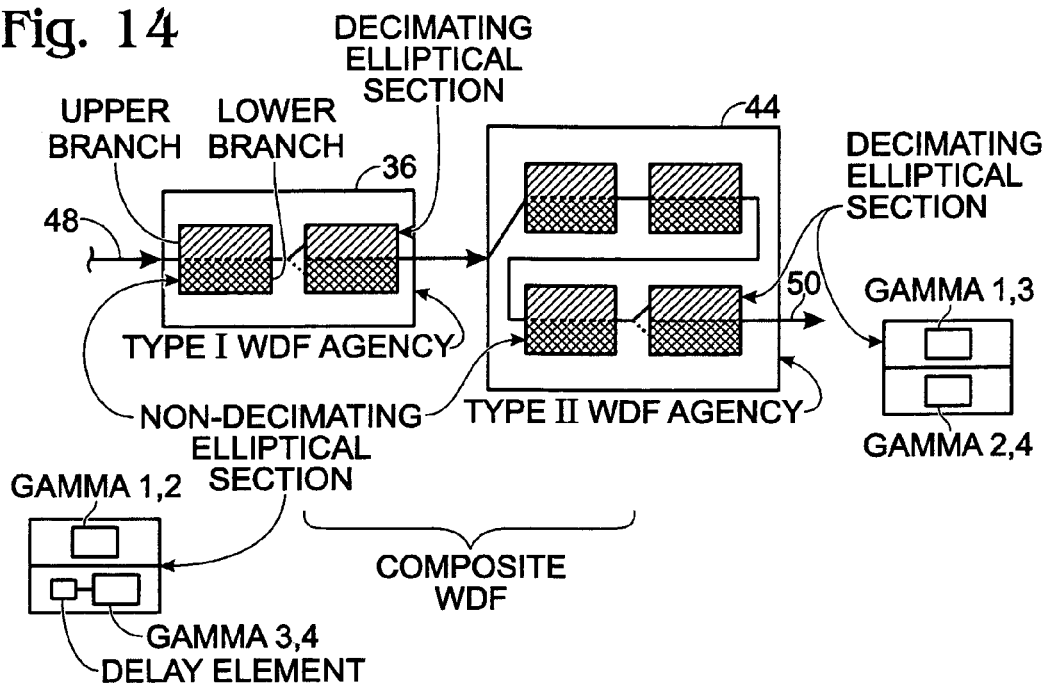
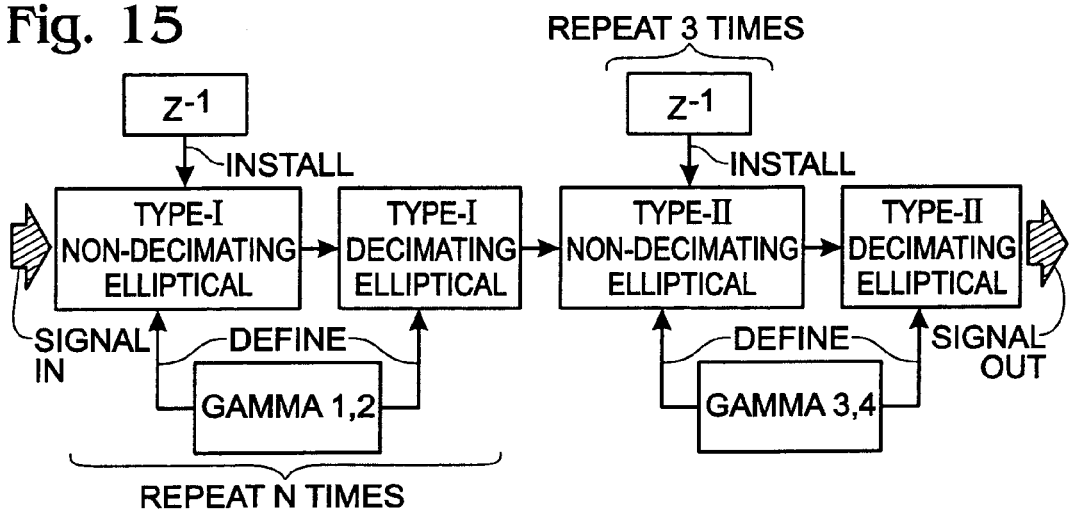
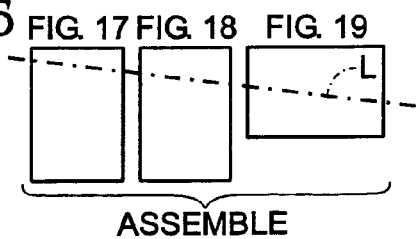

Fig. 17

CYCLE 1- read WDF1/branch1 Input from DPRAM1
read WDF1/branch1 registered data from DPRAM2
form recursive part of WDF1/branch1 via MUX1/Sum1

CYCLE 2- read WDF1/branch2 Input from DPRAM1
read WDF1/branch2 registered data from DPRAM2
form recursive part of WDF1/branch2 via MUX1/Sum1

CYCLE 3- read WDF2/branch1 Input from DPRAM1
read WDF2/branch1 registered data from DPRAM2
form recursive part of WDF2/branch1 via MUX1/Sum1

CYCLE 4- read WDF2/branch2 Input from DPRAM1
read WDF2/branch2 registered data from DPRAM2
form recursive part of WDF2/branch2 via MUX1/Sum1

CYCLE 5- read WDF3/branch1 Input from DPRAM1
read WDF3/branch1 registered data from DPRAM2
form recursive part of WDF3/branch1 via MUX1/Sum1

CYCLE 6- read WDF3/branch2 Input from DPRAM1
read WDF3/branch2 registered data from DPRAM2
form recursive part of WDF3/branch2 via MUX1/Sum1

CYCLE 7- read WDF4/branch1 Input from DPRAM1
read WDF4/branch1 registered data from DPRAM2
form recursive part of WDF4/branch1 via MUX1/Sum1

Fig. 18

CYCLE 1- store WDFZ/branch2 Sum1 O/P in Reg1
store WDFZ/branch2 DPRAM2 O/P in Reg2     move WDFZ/branch1
write WDFZ/branch2 Sum1 O/P to DPRAM2      Sum2 to Reg3
form WDFZ/branch2 all-pass output via MUX2/Sum2

CYCLE 2- store WDF1/branch1 Sum1 O/P in Reg1
store WDF1/branch1 DPRAM2 O/P in Reg2     move WDFZ/branch2
write WDF1/branch1 Sum1 O/P to DPRAM2      Sum2 to Reg3
form WDF1/branch1 all-pass output via MUX2/Sum2

CYCLE 3- store WDF1/branch2 Sum1 O/P in Reg1
store WDF1/branch2 DPRAM2 O/P in Reg2     move WDF1/branch1
write WDF1/branch2 Sum1 O/P to DPRAM2      Sum2 to Reg3
form WDF1/branch2 all-pass output via MUX2/Sum2

CYCLE 4- store WDF2/branch1 Sum1 O/P in Reg1
store WDF2/branch1 DPRAM2 O/P in Reg2     move WDF1/branch2
write WDF2/branch1 Sum1 O/P to DPRAM2      Sum2 to Reg3
form WDF2/branch1 all-pass output via MUX2/Sum2

CYCLE 5- store WDF2/branch2 Sum1 O/P in Reg1
store WDF2/branch2 DPRAM2 O/P in Reg2     move WDF2/branch1
write WDF2/branch2 Sum1 O/P to DPRAM2      Sum2 to Reg3
form WDF2/branch2 all-pass output via MUX2/Sum2

CYCLE 6- store WDF3/branch1 Sum1 O/P in Reg1
store WDF3/branch1 DPRAM2 O/P in Reg2     move WDF2/branch2
write WDF3/branch1 Sum1 O/P to DPRAM2      Sum2 to Reg3
form WDF3/branch1 all-pass output via MUX2/Sum2

CYCLE 7- store WDF3/branch2 Sum1 O/P in Reg1
store WDF3/branch2 DPRAM2 O/P in Reg2     move WDF3/branch1
write WDF3/branch2 Sum1 O/P to DPRAM2      Sum2 to Reg3
form WDF3/branch2 all-pass output via MUX2/Sum2

Fig. 25

DPRAM 1 WRITE ADDRESS

|      | 0  | 1 | 2  | 3   | 4  | 5 | 6  | 7   | 8  | 9 | A  | B   | C  | D  | E  | F  |
|------|----|---|----|-----|----|---|----|-----|----|---|----|-----|----|----|----|----|
| 0000 | 1F | 2 | 1F | 4 - | 1F | 6 | 1F | 8 - | 1F | 3 | 1F | 1F - | 1F | A  | 1F | C  |
| 0010 | 1F | 2 | 1F | 5 - | 1F | 7 | 1F | 1F - | 1F | 3 | 1F | 1F - | 1F | E  | 1F | 10 |
| 0020 | 1F | 2 | 1F | 4 - | 1F | 6 | 1F | 9 - | 1F | 3 | 1F | 1F - | 1F | B  | 1F | 1F |
| 0030 | 1F | 2 | 1F | 5 - | 1F | 7 | 1F | 1F - | 1F | 3 | 1F | 1F - | 1F | 12 | 1F | 14 |
| 0040 | 1F | 2 | 1F | 4 - | 1F | 6 | 1F | 8 - | 1F | 3 | 1F | 1F - | 1F | A  | 1F | D  |
| 0050 | 1F | 2 | 1F | 5 - | 1F | 7 | 1F | 1F - | 1F | 3 | 1F | 1F - | 1F | F  | 1F | 1F |
| 0060 | 1F | 2 | 1F | 4 - | 1F | 6 | 1F | 9 - | 1F | 3 | 1F | 1F - | 1F | B  | 1F | 1F |
| 0070 | 1F | 2 | 1F | 5 - | 1F | 7 | 1F | 1F - | 1F | 3 | 1F | 1F - | 1F | 16 | 1F | 18 |
| 0080 | 1F | 2 | 1F | 4 - | 1F | 6 | 1F | 8 - | 1F | 3 | 1F | 1F - | 1F | A  | 1F | C  |
| 0090 | 1F | 2 | 1F | 5 - | 1F | 7 | 1F | 1F - | 1F | 3 | 1F | 1F - | 1F | E  | 1F | 11 |
| 00A0 | 1F | 2 | 1F | 4 - | 1F | 6 | 1F | 9 - | 1F | 3 | 1F | 1F - | 1F | B  | 1F | 1F |
| 00B0 | 1F | 2 | 1F | 5 - | 1F | 7 | 1F | 1F - | 1F | 3 | 1F | 1F - | 1F | 13 | 1F | 1F |
| 00C0 | 1F | 2 | 1F | 4 - | 1F | 6 | 1F | 8 - | 1F | 3 | 1F | 1F - | 1F | A  | 1F | D  |
| 00D0 | 1F | 2 | 1F | 5 - | 1F | 7 | 1F | 1F - | 1F | 3 | 1F | 1F - | 1F | F  | 1F | 1F |
| 00E0 | 1F | 2 | 1F | 4 - | 1F | 6 | 1F | 9 - | 1F | 3 | 1F | 1F - | 1F | B  | 1F | 1F |
| 00F0 | 1F | 2 | 1F | 5 - | 1F | 7 | 1F | 1F - | 1F | 3 | 1F | 1F - | 1F | 1A | 1F | 1C |
| 0100 | 1F | 2 | 1F | 4 - | 1F | 6 | 1F | 8 - | 1F | 3 | 1F | 1F - | 1F | A  | 1F | C  |
| 0110 | 1F | 2 | 1F | 5 - | 1F | 7 | 1F | 1F - | 1F | 3 | 1F | 1F - | 1F | E  | 1F | 10 |
| 0120 | 1F | 2 | 1F | 4 - | 1F | 6 | 1F | 9 - | 1F | 3 | 1F | 1F - | 1F | B  | 1F | 1F |
| 0130 | 1F | 2 | 1F | 5 - | 1F | 7 | 1F | 1F - | 1F | 3 | 1F | 1F - | 1F | 12 | 1F | 15 |
| 0140 | 1F | 2 | 1F | 4 - | 1F | 6 | 1F | 8 - | 1F | 3 | 1F | 1F - | 1F | A  | 1F | D  |
| 0150 | 1F | 2 | 1F | 5 - | 1F | 7 | 1F | 1F - | 1F | 3 | 1F | 1F - | 1F | F  | 1F | 1F |
| 0160 | 1F | 2 | 1F | 4 - | 1F | 6 | 1F | 9 - | 1F | 3 | 1F | 1F - | 1F | B  | 1F | 1F |
| 0170 | 1F | 2 | 1F | 5 - | 1F | 7 | 1F | 1F - | 1F | 3 | 1F | 1F - | 1F | 17 | 1F | 19 |
| 0180 | 1F | 2 | 1F | 4 - | 1F | 6 | 1F | 8 - | 1F | 3 | 1F | 1F - | 1F | A  | 1F | C  |
| 0190 | 1F | 2 | 1F | 5 - | 1F | 7 | 1F | 1F - | 1F | 3 | 1F | 1F - | 1F | E  | 1F | 11 |
| 01A0 | 1F | 2 | 1F | 4 - | 1F | 6 | 1F | 9 - | 1F | 3 | 1F | 1F - | 1F | B  | 1F | 1F |
| 01B0 | 1F | 2 | 1F | 5 - | 1F | 7 | 1F | 1F - | 1F | 3 | 1F | 1F - | 1F | 13 | 1F | 1F |
| 01C0 | 1F | 2 | 1F | 4 - | 1F | 6 | 1F | 8 - | 1F | 3 | 1F | 1F - | 1F | A  | 1F | D  |
| 01D0 | 1F | 2 | 1F | 5 - | 1F | 7 | 1F | 1F - | 1F | 3 | 1F | 1F - | 1F | F  | 1F | 1F |
| 01E0 | 1F | 2 | 1F | 4 - | 1F | 6 | 1F | 9 - | 1F | 3 | 1F | 1F - | 1F | B  | 1F | 1F |
| 01F0 | 1F | 2 | 1F | 5 - | 1F | 7 | 1F | 1F - | 1F | 3 | 1F | 1F - | 1F | 1B | 1F | 1F |

Fig. 26

DPRAM 1 READ ADDRESS

|      | 0 | 1 | 2 | 3 | 4 | 5 | 6 | 7 | 8 | 9 | A | B | C | D | E | F |
|------|---|---|---|---|---|---|---|---|---|---|---|---|---|---|---|---|
| 0000 | 0 | 1 | 2 | 3 | - | 4 | 5 | 6 | 7 | - | 1 | 0 | 3 | 2 | - | 8 | 9 | A | B |
| 0010 | 0 | 1 | 2 | 3 | - | 5 | 4 | 7 | 6 | - | 1 | 0 | 3 | 2 | - | C | D | E | F |
| 0020 | 0 | 1 | 2 | 3 | - | 4 | 5 | 6 | 7 | - | 1 | 0 | 3 | 2 | - | 9 | 8 | B | A |
| 0030 | 0 | 1 | 2 | 3 | - | 5 | 4 | 7 | 6 | - | 1 | 0 | 3 | 2 | - | 10 | 11 | 12 | 13 |
| 0040 | 0 | 1 | 2 | 3 | - | 4 | 5 | 6 | 7 | - | 1 | 0 | 3 | 2 | - | 8 | 9 | A | B |
| 0050 | 0 | 1 | 2 | 3 | - | 5 | 4 | 7 | 6 | - | 1 | 0 | 3 | 2 | - | D | C | F | E |
| 0060 | 0 | 1 | 2 | 3 | - | 4 | 5 | 6 | 7 | - | 1 | 0 | 3 | 2 | - | 9 | 8 | B | A |
| 0070 | 0 | 1 | 2 | 3 | - | 5 | 4 | 7 | 6 | - | 1 | 0 | 3 | 2 | - | 14 | 15 | 16 | 17 |
| 0080 | 0 | 1 | 2 | 3 | - | 4 | 5 | 6 | 7 | - | 1 | 0 | 3 | 2 | - | 8 | 9 | A | B |
| 0090 | 0 | 1 | 2 | 3 | - | 5 | 4 | 7 | 6 | - | 1 | 0 | 3 | 2 | - | C | D | E | F |
| 00A0 | 0 | 1 | 2 | 3 | - | 4 | 5 | 6 | 7 | - | 1 | 0 | 3 | 2 | - | 9 | 8 | B | A |
| 00B0 | 0 | 1 | 2 | 3 | - | 5 | 4 | 7 | 6 | - | 1 | 0 | 3 | 2 | - | 11 | 10 | 13 | 12 |
| 00C0 | 0 | 1 | 2 | 3 | - | 4 | 5 | 6 | 7 | - | 1 | 0 | 3 | 2 | - | 8 | 9 | A | B |
| 00D0 | 0 | 1 | 2 | 3 | - | 5 | 4 | 7 | 6 | - | 1 | 0 | 3 | 2 | - | D | C | F | E |
| 00E0 | 0 | 1 | 2 | 3 | - | 4 | 5 | 6 | 7 | - | 1 | 0 | 3 | 2 | - | 9 | 8 | B | A |
| 00F0 | 0 | 1 | 2 | 3 | - | 5 | 4 | 7 | 6 | - | 1 | 0 | 3 | 2 | - | 18 | 19 | 1A | 1B |
| 0100 | 0 | 1 | 2 | 3 | - | 4 | 5 | 6 | 7 | - | 1 | 0 | 3 | 2 | - | 8 | 9 | A | B |
| 0110 | 0 | 1 | 2 | 3 | - | 5 | 4 | 7 | 6 | - | 1 | 0 | 3 | 2 | - | C | D | E | F |
| 0120 | 0 | 1 | 2 | 3 | - | 4 | 5 | 6 | 7 | - | 1 | 0 | 3 | 2 | - | 9 | 8 | B | A |
| 0130 | 0 | 1 | 2 | 3 | - | 5 | 4 | 7 | 6 | - | 1 | 0 | 3 | 2 | - | 10 | 11 | 12 | 13 |
| 0140 | 0 | 1 | 2 | 3 | - | 4 | 5 | 6 | 7 | - | 1 | 0 | 3 | 2 | - | 8 | 9 | A | B |
| 0150 | 0 | 1 | 2 | 3 | - | 5 | 4 | 7 | 6 | - | 1 | 0 | 3 | 2 | - | D | C | F | E |
| 0160 | 0 | 1 | 2 | 3 | - | 4 | 5 | 6 | 7 | - | 1 | 0 | 3 | 2 | - | 9 | 8 | B | A |
| 0170 | 0 | 1 | 2 | 3 | - | 5 | 4 | 7 | 6 | - | 1 | 0 | 3 | 2 | - | 15 | 14 | 17 | 16 |
| 0180 | 0 | 1 | 2 | 3 | - | 4 | 5 | 6 | 7 | - | 1 | 0 | 3 | 2 | - | 8 | 9 | A | B |
| 0190 | 0 | 1 | 2 | 3 | - | 5 | 4 | 7 | 6 | - | 1 | 0 | 3 | 2 | - | C | D | E | F |
| 01A0 | 0 | 1 | 2 | 3 | - | 4 | 5 | 6 | 7 | - | 1 | 0 | 3 | 2 | - | 9 | 8 | B | A |
| 01B0 | 0 | 1 | 2 | 3 | - | 5 | 4 | 7 | 6 | - | 1 | 0 | 3 | 2 | - | 11 | 10 | 13 | 12 |
| 01C0 | 0 | 1 | 2 | 3 | - | 4 | 5 | 6 | 7 | - | 1 | 0 | 3 | 2 | - | 8 | 9 | A | B |
| 01D0 | 0 | 1 | 2 | 3 | - | 5 | 4 | 7 | 6 | - | 1 | 0 | 3 | 2 | - | D | C | F | E |
| 01E0 | 0 | 1 | 2 | 3 | - | 4 | 5 | 6 | 7 | - | 1 | 0 | 3 | 2 | - | 9 | 8 | B | A |
| 01F0 | 0 | 1 | 2 | 3 | - | 5 | 4 | 7 | 6 | - | 1 | 0 | 3 | 2 | - | 19 | 18 | 1B | 1A |

Fig. 27

DPRAM 2 READ-WRITE ADDRESS

|      | 0 | 1 | 2 | 3 | 4 | 5 | 6 | 7 | 8 | 9 | A | B | C  | D  | E  | F  |
|------|---|---|---|---|---|---|---|---|---|---|---|---|----|----|----|----|
| 0000 | 0 | 2 | 4 | 6 | - | 8 | A | C | E | - | 1 | 3 | 5 | 7 | - 10 | 12 14 16 |
| 0010 | 0 | 2 | 4 | 6 | - | 9 | B | D | F | - | 1 | 3 | 5 | 7 | - 18 | 1A 1C 1E |
| 0020 | 0 | 2 | 4 | 6 | - | 8 | A | C | E | - | 1 | 3 | 5 | 7 | - 11 | 13 15 17 |
| 0030 | 0 | 2 | 4 | 6 | - | 9 | B | D | F | - | 1 | 3 | 5 | 7 | - 20 | 22 24 26 |
| 0040 | 0 | 2 | 4 | 6 | - | 8 | A | C | E | - | 1 | 3 | 5 | 7 | - 10 | 12 14 16 |
| 0050 | 0 | 2 | 4 | 6 | - | 9 | B | D | F | - | 1 | 3 | 5 | 7 | - 19 | 1B 1D 1F |
| 0060 | 0 | 2 | 4 | 6 | - | 8 | A | C | E | - | 1 | 3 | 5 | 7 | - 11 | 13 15 17 |
| 0070 | 0 | 2 | 4 | 6 | - | 9 | B | D | F | - | 1 | 3 | 5 | 7 | - 28 | 2A 2C 2E |
| 0080 | 0 | 2 | 4 | 6 | - | 8 | A | C | E | - | 1 | 3 | 5 | 7 | - 10 | 12 14 16 |
| 0090 | 0 | 2 | 4 | 6 | - | 9 | B | D | F | - | 1 | 3 | 5 | 7 | - 18 | 1A 1C 1E |
| 00A0 | 0 | 2 | 4 | 6 | - | 8 | A | C | E | - | 1 | 3 | 5 | 7 | - 11 | 13 15 17 |
| 00B0 | 0 | 2 | 4 | 6 | - | 9 | B | D | F | - | 1 | 3 | 5 | 7 | - 21 | 23 25 27 |
| 00C0 | 0 | 2 | 4 | 6 | - | 8 | A | C | E | - | 1 | 3 | 5 | 7 | - 10 | 12 14 16 |
| 00D0 | 0 | 2 | 4 | 6 | - | 9 | B | D | F | - | 1 | 3 | 5 | 7 | - 19 | 1B 1D 1F |
| 00E0 | 0 | 2 | 4 | 6 | - | 8 | A | C | E | - | 1 | 3 | 5 | 7 | - 11 | 13 15 17 |
| 00F0 | 0 | 2 | 4 | 6 | - | 9 | B | D | F | - | 1 | 3 | 5 | 7 | - 30 | 32 34 36 |
| 0100 | 0 | 2 | 4 | 6 | - | 8 | A | C | E | - | 1 | 3 | 5 | 7 | - 10 | 12 14 16 |
| 0110 | 0 | 2 | 4 | 6 | - | 9 | B | D | F | - | 1 | 3 | 5 | 7 | - 18 | 1A 1C 1E |
| 0120 | 0 | 2 | 4 | 6 | - | 8 | A | C | E | - | 1 | 3 | 5 | 7 | - 11 | 13 15 17 |
| 0130 | 0 | 2 | 4 | 6 | - | 9 | B | D | F | - | 1 | 3 | 5 | 7 | - 20 | 22 24 26 |
| 0140 | 0 | 2 | 4 | 6 | - | 8 | A | C | E | - | 1 | 3 | 5 | 7 | - 10 | 12 14 16 |
| 0150 | 0 | 2 | 4 | 6 | - | 9 | B | D | F | - | 1 | 3 | 5 | 7 | - 19 | 1B 1D 1F |
| 0160 | 0 | 2 | 4 | 6 | - | 8 | A | C | E | - | 1 | 3 | 5 | 7 | - 11 | 13 15 17 |
| 0170 | 0 | 2 | 4 | 6 | - | 9 | B | D | F | - | 1 | 3 | 5 | 7 | - 29 | 2B 2D 2F |
| 0180 | 0 | 2 | 4 | 6 | - | 8 | A | C | E | - | 1 | 3 | 5 | 7 | - 10 | 12 14 16 |
| 0190 | 0 | 2 | 4 | 6 | - | 9 | B | D | F | - | 1 | 3 | 5 | 7 | - 18 | 1A 1C 1E |
| 01A0 | 0 | 2 | 4 | 6 | - | 8 | A | C | E | - | 1 | 3 | 5 | 7 | - 11 | 13 15 17 |
| 01B0 | 0 | 2 | 4 | 6 | - | 9 | B | D | F | - | 1 | 3 | 5 | 7 | - 21 | 23 25 27 |
| 01C0 | 0 | 2 | 4 | 6 | - | 8 | A | C | E | - | 1 | 3 | 5 | 7 | - 10 | 12 14 16 |
| 01D0 | 0 | 2 | 4 | 6 | - | 9 | B | D | F | - | 1 | 3 | 5 | 7 | - 19 | 1B 1D 1F |
| 01E0 | 0 | 2 | 4 | 6 | - | 8 | A | C | E | - | 1 | 3 | 5 | 7 | - 11 | 13 15 17 |
| 01F0 | 0 | 2 | 4 | 6 | - | 9 | B | D | F | - | 1 | 3 | 5 | 7 | - 31 | 33 35 37 |

DIGITAL SIGNAL-PROCESSING STRUCTURE AND METHODOLOGY FEATURING ENGINE-INSTANTIATED, WAVE-DIGITAL-FILTER COMPONENTRY, AND FABRICATION THEREOF

BACKGROUND AND SUMMARY OF THE INVENTION

This invention relates generally to digital signal processing, and in a more specific sense to the creation, configuration and implementation of wave digital filter (WDF) structure and activity. As will become apparent to those generally skilled in this art, the various facets, the novel methodology, and the novel structure of this invention are adaptable to a very wide range of applications, just a few of which are specifically, but only generally, mentioned herein.

By way of background regarding this field of technology, most signal-processing systems employ two fundamental types of processing algorithms—fixed-function and data-dependent. Typical signal-processing systems use very high-throughput, fixed-function algorithms for front-end processing, such as band selection filtering or fast Fourier transforming. This front-end processing step is typically followed by the use of data-dependent algorithms for feature extraction and data classification. Front-end processes are typically implemented on high-performance, programmable, digital signal processors (DSPs), and micro-processor based architectures are commonly used to implement the front-end algorithms since they provide great flexibility.

High-performance filter functions are needed in most signal-processing applications. One common use of signal-processing systems is in signal filtering. Typical end-use requirements include decimation and filtering for sigma-delta modulator-based analog-to-digital converters for signal acquisition, for digital sample-rate converters to match signal parameters to various processing algorithms, and for spectral or frequency band analyses and selection for signal extraction.

Classically, finite impulse response filters (FIRs) are used in the above-identified applications. FIRs have the advantage of ease of design and unconditional stability. However, FIRs usually require considerable hardware resources, particularly in high dynamic range, multi-channel systems. Wave digital filters (WDFs) are attractive alternatives in these applications because of their low coefficient sensitivity and simple design. Additionally, by constraining the ratio of a filter's cut-off frequency to the clock rate in a filter algorithm, WDFs with low arithmetic complexity of only one or two multiplications per data input sample may be realized. These types of filters are approximately five to six times more hardware-efficient than the best FIR implementations for a given filter specification. Furthermore, by systematically searching constrained coefficient space, a number of WDF structures have been developed where a multiplication operation reduces to a simple hard-wired binary shift and add operation, an approach which reduces hardware complexity still further.

In this setting, where WDF circuitry is sought to be used as a preferential approach to signal processing, the WDF signal-processing technology of the present invention offers a significant new advance.

In accordance with the present invention, included among the several digital signal-processing advances which are offered by this invention are (1) a newly proposed WDF agency, (2) a newly proposed cascade series arrangement of WDF agencies, referred to herein as a composite WDF, one of which composite-contributing agencies is the just-mentioned, newly proposed WDF agency (1), and (3) a computer-based digital fabricating engine (and related methodology) which operate to generate (realize) on the fly, so-to-speak, by time-based instantiation in time-spaced phases, all of this agency (and agency-composite) structure (also referred to herein as phase-instantiated WDF structure). Among the "WDF agency structure" thus created by this engine, significantly, is a foundation filter "building block" which is referred to herein as a branch of a $5^{th}$-Order WDF elliptical filter section. Such a branch, and its different, specific, useful configurations, are illustrated and described hereinbelow in relation to a selected, dedicated drawing figure (FIG. 6) which is presented especially to highlight this feature of the invention. The proposed WDF-based structure and methodology of this invention are simple in construction and implementation, are adaptable to many applications, and offer, generally in the "world" of signal filtering, an impressive, steep (or short, or fast) transition-bandwidth performance which allows for sophisticated operation in, for example, multi-channel filtering environments.

For illustration purposes, a preferred and best-mode embodiment of, and manner of implementing and practicing, the present invention are disclosed herein in the setting of a multi-channel WDF implementation employing a unique, and especially short(fast)-transition-bandwidth, composite WDF made up of two, concatenated WDF agencies, referred to herein as Type-I and Type-II WDF agencies. The Type-II WDF agency discussed herein is one of the new and unique contributions (to the art) of the present invention. As will be seen, it is the fast transition bandwidth of this new Type-II WDF agency which causes the mentioned composite WDF to exhibit the unique and special, overall, fast "composite" transition bandwidth offered by the present invention.

This multi-channel WDF implementation exploits the generally fast-transition bandwidth of WDF technology, and uniquely uses time-division, or time-sliced, multiplexing in the transitory, instantiated forming of various WDF building blocks (functional digital circuitry) to process multiple channels of data using the mentioned, effectively single, composite WDF. In a multiple-channel filtering system, and among many of the advantages offered by the invention, the cost, for example, of an employed arithmetic logic unit (ALU) can be spread over the total number of processed channels. This is possible because the speed of operation of the proposed, new Type-II WDF agency is much faster than counterpart, conventional WDF agencies, due, at least in part, to the new agency's very simple, effective hardware structure. Hence, an ALU which is used with the WDF structure of the present invention can easily and very efficiently be time-multiplexed (sliced) over, and offered transitorily to, a number of input signal channels.

Thus, included among the important and unique contributions of this invention are (1) a new type of fast-transition-bandwidth, decimating WDF agency, referred to herein as a Type-II agency, constructed with four, concatenated (in a cascade series), $5^{th}$-Order elliptical signal-processing sections, and (2) a new type of decimating, composite WDF filter which is formed of a concatenated combination (also in a cascade series) of a single Type-II agency, and upstream therefrom, at least one decimating WDF agency, referred to herein as a Type-I agency, constructed with a pair of concatenated $5^{th}$-Order elliptical sections. The four elliptical sections in the new Type-II agency include three upstream, non-decimating sections, and a fourth, downstream decimating section. The two elliptical sections in the Type-I agency include an upstream, non-decimating section, and a downstream, decimating section. More than a single Type-I agency may be employed in a composite WDF structure formed in accordance with the invention, and the preferred embodiment of the invention is illustrated herein in a setting which employs four such agencies—concatenated.

Each elliptical section in each type agency is formed with a parallel pair of branches, referred to herein as upper and lower branches, and every such branch includes a twin-summing-node-connected, parallel arrangement formed with a defined Z-transform function block bracketed by a pair of Gamma-factor multipliers. Within each elliptical section, the Gamma factors associated respectively with these "function blocks" in the upper and lower branches are different, but are the same within each branch, per se, and the specific Gamma factors which are associated respectively with the elliptical sections forming the Type-I and Type-II agencies differ from one another. There are four Gamma factors employed herein, and these are referred to as Gamma 1 and Gamma 2 (used in each Type-I WDF agency), and Gamma 3 and Gamma 4 (used in each Type-II WDF agency).

Non-decimating elliptical sections distinguish generally from decimating elliptical sections by the facts that their lower branches (in the non-decimating sections) include an additional, series-connected, Z-function, delay element, and that they possess but a single "input terminal". Decimating sections do not possess such a delay element, and are characterized, effectively, by a pair of individually, and mutually exclusively, selectable "input terminals".

Further contributed by the present invention is the earlier-mentioned, computer-based, digital fabricating engine which operates in an on-the-fly, time-sliced manner to instantiate all of the above-discussed signal-processing structure (and functionality) just as such are needed to perform signal processing. A signal presented to the environment of this invention "passes through" that environment in a manner "managed" by this engine so as to be "engaged" by the various branches, sections and agencies mentioned above, and in the correct order, so as to become appropriately processed.

What this engine, thus, does during operation is to create, in effect, a seriatim secession of $5^{th}$-Order elliptical-section branches (upper and lower), appropriately ordered in time, and organized, with respect to signal flow, so as to create a succession of whole elliptical sections, which are, in turn, organized in time to produce the correct concatenated arrangement of Type-I and Type-II agencies. This engine can thus be thought of fundamentally as being provided, via code-control instructions, with a basic template for the creation, over a defined time span within a particular extent of time, of $5^{th}$-Order elliptical-section branches, and then sequentially furnished with appropriate data informing it (a) whether it is to create a Type-I or a Type-II agency, (b) whether, within such a singularly defined agency, it is to create, during a particular short span of time, a decimating or a non-decimating elliptical section, (c) what appropriate Gamma factor should be used to define the multipliers in the upper and lower elliptical-section branches, and (d), with regard to a lower branch, whether it is to include the above-mentioned, additional Z-function delay element. Effectively, the engine creates these "things" as structural and functional portions of itself between what are referred to herein as signal input and output zones.

DESCRIPTION OF THE DRAWINGS

FIG. 14 is provided as an aid to understanding the names given herein to identify different structural and methodologic regions in the overall configuration of the present invention.

FIG. 15 presents a complete block/schematic diagram fully illustrating the operation of the fabricating engine proposed by the present invention, and thus fully describing the basic operational practice of the invention.

FIG. 16 is a view which is provided as an aid to understanding how FIGS. 17-19, inclusive, may be arranged physically to display certain engine-performed actions which are implemented by the engine of FIG. 13 to instantiate the upper and lower branches of a $5^{th}$-Order elliptical section, such as those sections shown in FIGS. 4 and 5.

FIGS. 17-19, inclusive, describe, in row-and-column form, the upper and lower branch-instantiation activities mentioned in relation to the description of FIG. 16.

FIGS. 25-27, inclusive, present detailed micro-code listings for the read and write, memory-access addressing activities of the components of the structures shown in FIGS. 20-24, inclusive, in specific relation to the operative engagements that take place with two dual-port RAM memories which form part of the engine pictured in FIG. 13. These listings are directly related to the upper and lower, branch-formation engine steps which are presented in FIGS. 17-19, inclusive.

DETAILED DESCRIPTION OF THE INVENTION

Figure 1:
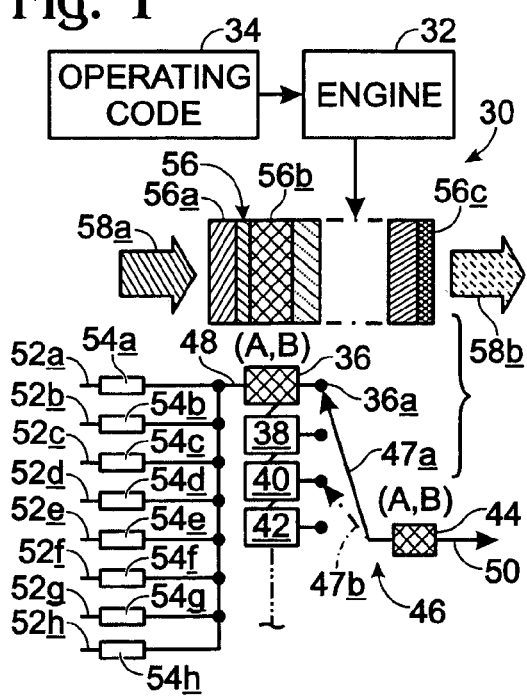
FIG. 1 is a block/schematic illustration of the overall WDF structure and methodology of the present invention.

Turning now to the drawings, and referring first of all to FIGS. 1, 2, 4 and 14, let us note at the outset that a consideration of FIG. 14 is useful throughout the invention description provided herein to aid in visualizing how certain terminology employed in this description relates both to the structural and to the methodologic features of the invention. In FIG. 1, a digital signal-processing system (or structure) and methodology of the present invention, in their respective preferred and best-mode forms, are indicated generally at 30. Speaking from a systemic point of view, system 30 effectively includes a time-slice-based, and computer-based, digital fabricating engine 32 which operates under the control of an appropriate micro-code to create, on an instantiation basis, what are referred to herein as concatenated Type-I (early-stage) and concatenated Type-II (later stage) wave digital filter (WDF) agencies, such as those shown at 36, 38, 40, 42 (each an identical Type-I agency), and 44 (a Type-II agency). Block 34 which represents the just-mentioned control micro-code is also referred to herein both as software operating structure, and as control code structure.

Collectively, these Type-I and Type-II WDF agencies constitute what is referred to herein both as a composite WDF, and as a time-slice instantiated, wave digital filter assembly (WFDA), indicated generally at 46. This composite WDF, or WDFA, is segregated and isolated for focus in FIG. 2.

Figure 2:
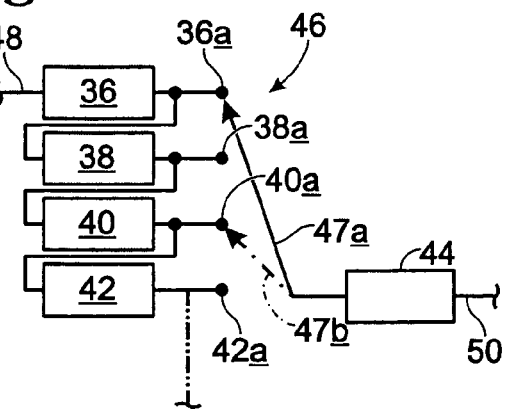
FIG. 2 shows, in an isolated manner, a composite WDF portion of what is pictured in FIG. 1.

Each WFDA includes at least one Type-I agency, and only one Type-II agency. Each WDFA may include plural Type-I agencies, and system 30 is shown herein including four such agencies (mentioned above as agencies 36, 38, 40, 42). FIGS. 1 and 2 clearly show that plural Type-I agencies, called an arrangement of such agencies, are concatenated in a manner whereby the output sides (the right sides) of certain ones of the Type-I agencies are connected to the input sides (the left sides) of certain other ones of these agencies.

Selectable output taps 36a, 38a, 40a, 42a for agencies 36, 38, 40, 42, respectively, are provided for selective connection to the input side (the left side) of Type-II agency 44. A solid arrow-headed line 47a is shown connecting the output side of agency 36 (tap 36a) to the input aide of agency 44. A dash-dot arrow-headed line 47b is shown connecting the output side (tap 40a) to the input side of agency 44. Such Type-I to Type-II agency connections are specifically selectable by engine 32 for each created WDFA, depending upon how many "stages" of Type-I-agency signal processing are called for.

The entire collection of output taps for the Type-I agencies is referred to herein as an output region. The right side of Type-II agency 44 constitutes its output side.

Figure 3:
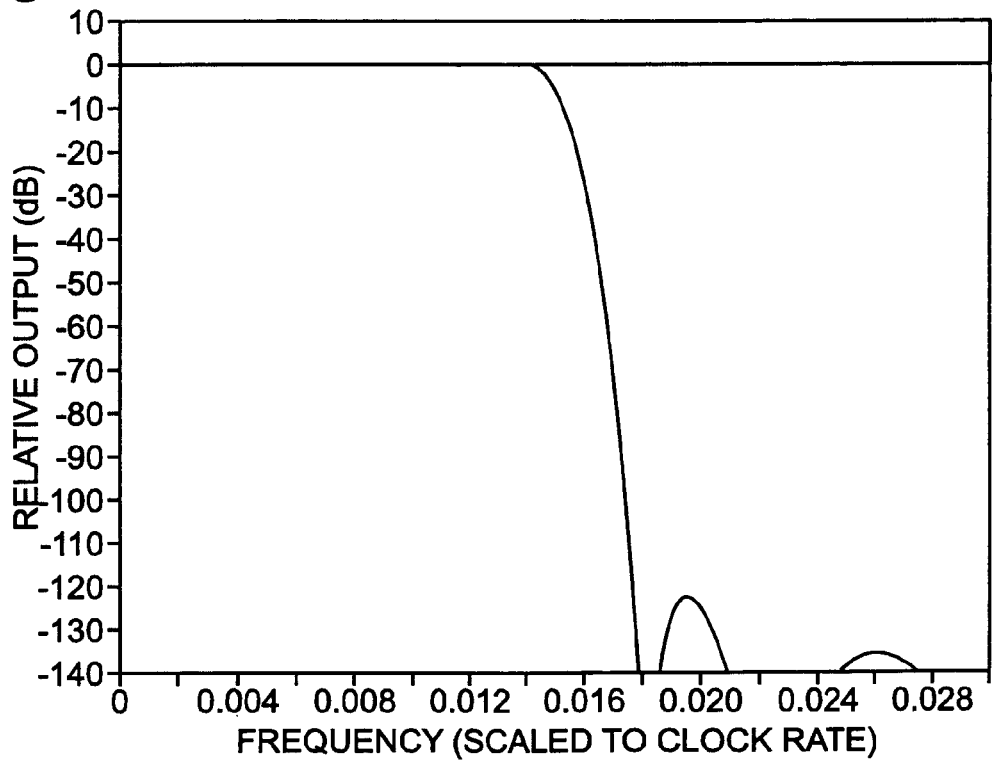
FIG. 3 illustrates the transfer function of the composite WDF portion shown in FIG. 2.

As will be pointed out later with reference to FIGS. 10 and 12, the Type-I and Type-II agencies provide different, respective filtering transfer functions which are characterized with different transmission bandwidths. The transfer function of each Type-I agency is referred to herein as a first transfer function, and its transmission bandwidth is referred to as a first transmission bandwidth. The transfer function of a Type-II agency is referred to herein as a second transfer function, and its transmission bandwidth is referred to as a second transmission bandwidth. The transition bandwidth of Type-II agency 44 is less than the like transmission bandwidths of Type-I agencies 36, 38, 40, 42. The transfer function, and overall transmission bandwidth, of WDFA (composite WDF) 46 are illustrated in FIG. 3.

WDFA 46 is appropriately connected to signal input and output structures 48, 50, respectively, and, in the invention form now being described, is appropriately supplied with time-successive digital signals for processing, on a channel-by-channel basis, from a plurality of channels $52a$-$52h$, inclusive, through an associated, respective plurality of generally conventional, decimate-by-four, finite impulse response filters $54a$-$54h$, inclusive. Channels $52a$-$52h$ and filters $54a$-$54h$, inclusive, are collectively referred to as plural-channel signal feed structure, and the right-side of this feed structure in FIG. 1 is called an output side for this structure. Structures 48, 50 herein are also referred to as signal input and output zones, respectively.

With regard to what has been generally described so far in system 30, it is important to note that, whereas all of the basic, high-level schematic views of the system "components" are shown in a "simultaneous existence" manner in FIGS. 1 and 2, they actually do not ever exist fully at the same moment in time. Rather, they are created in a staged, time-selected, instantiated way, by engine 32, as they, and constituent portions of them, are needed to implement the processing of a signal passing through a WDFA. Stylized block 56 in FIG. 1, which is shaded into different laterally displayed regions, such as the three, left-to-right displaced regions shown at $56a$, $56b$, $56c$ within this block, represents such time-slice instantiation for the creation of an appropriate, single WDFA. Relative to block 56, an input signal which is to be processed is shown at $58a$, and the resulting processed output signal is shown at $58b$. According to practice of the present invention, each such signal to be processed is presented in its various stages of "intermediate" processing, and ultimately and in the correct processing manner, to the various signal-processing constituent elements of a single, instantiated WDFA.

For illustrative and explanatory purposes herein, operation of system 30 is described simply in the context of the instantiated creation of a single WDFA "possessing" a single Type-I WDF agency.

Directing attention now to FIGS. 4-9, inclusive, and 11, these figures, with somewhat differing degrees of specificity, illustrate the fundamental building blocks (the componentry) of the high-level illustrations furnished in FIGS. 1 and 2 for the Type-I and Type-II WDF agencies. Specifically, these building blocks are described in the structural context of previously mentioned Type-I agency 36 and Type-II agency 44.

Figure 4:
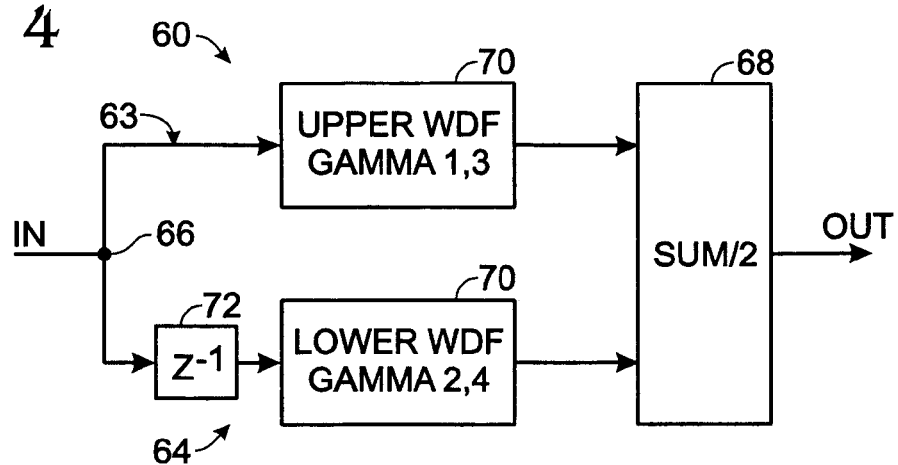
FIG. 4 is a block/schematic diagram generally illustrating a non-decimating $5^{th}$-Order elliptical section which is employed in the practice of the present invention.
Figure 5:
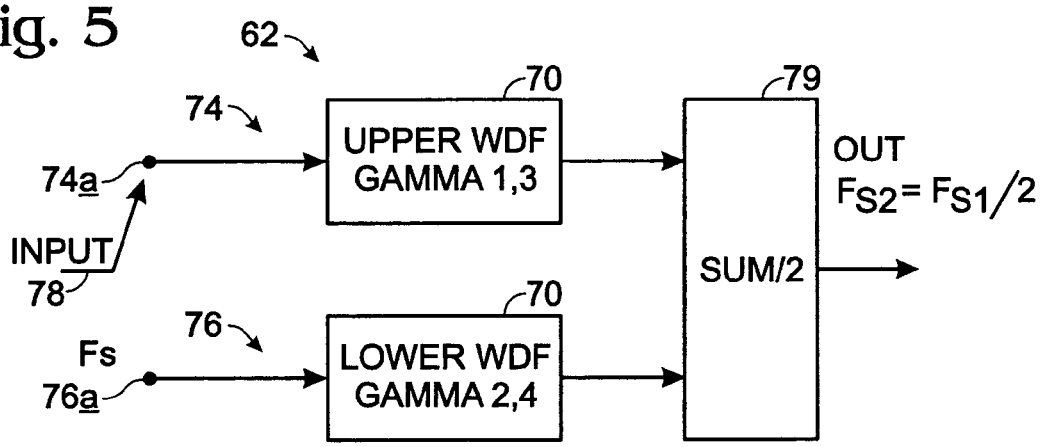
FIG. 5 is a block/schematic diagram generally illustrating a decimating (decimate-by-two) $5^{th}$-Order elliptical section which is employed in the practice of the invention.

Beginning with FIGS. 4 and 5, FIGS. 4 and 5 diagram, respectively, what are referred to herein as a non-decimating, $5^{th}$-Order elliptical, signal-processing section 60, and a decimating (decimate-by-two), $5^{th}$-Order elliptical, signal-processing section 62, which are created transitorily by engine 32, and associated in different ways with one another to generate the above-described Type-I and Type-II agencies.

Figure 6:
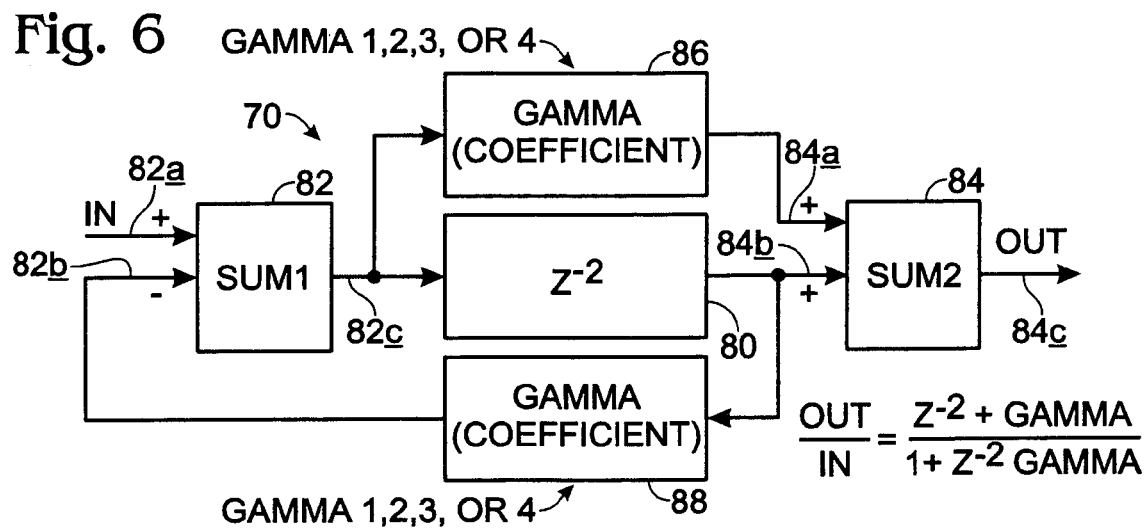
FIG. 6 is a block/schematic diagram generally illustrating the make-up of each of the blocks in FIGS. 4 and 5 which are labeled, respectively, Upper and Lower WDF Gamma 1, 3, and Upper and Lower WDF Gamma 2, 4.

Section 60 includes upper and lower, parallel, all-pass branches 63, 64 respectively, which connect at a pair of spaced summing nodes 66, 68. Summing node 68 is actually a SUM/2 node. Included in each of upper and lower branches 63, 64 is a block 70 which is referred to herein as an all-pass transform block (or "function"), the details of which are shown in FIG. 6, and which performs in accordance with the equation:

$$H(Z) = \frac{\text{Gamma} + Z^{-2}}{1 + \text{Gamma}(Z^{-2})}$$

Lower branch 64 additionally includes, in series with block 70, and on the node-66 side of block 70, a $Z^{-1}$ transform function block 72 which performs in accordance with the equation:

$$H(Z) = Z^{-1}$$

Block 72 constitutes what is also called a delay element herein.

Decimating elliptical section 62 includes identical upper and lower parallel all-pass branches 74, 76, respectively, each of which includes a transform block 70 (previously mentioned), and neither of which includes a delay element 72. In section 62, branches 74, 76 are referred to herein also as mutually exclusive through paths, the left ends of which (as seen in FIG. 5) provide selectable inputs 74a, 76a, respectively. One or the other of these inputs is selected appropriately by engine 32 for signal-flow connection to a singular, upstream input 78. The right ends of branches 74, 76 in FIG. 5 are connected at a summing (SUM/2) node 79 which is like previously mentioned node 68.

As was mentioned above, greater details of construction of each block 70 are pictured in FIG. 6. Each of these blocks 70 includes a central $Z^{-2}$ transform function block 80, the left and right sides of which in FIG. 6 connect with summing nodes 82, 84, respectively. Node 82 includes plus (+) and minus (−) input terminals 82a, 82b, respectively, and an output terminal 82c. Node 84 includes a pair of plus (+) input terminals 84a, 84b, and an output terminal 84c. Block 80 performs in accordance with the equation:

$$H(Z) = Z^{-2}.$$

Functionally bracketing block 80 are two fixed-Gamma-factor multipliers 86, 88. In FIG. 6, the left side of multiplier 86 connects with the interconnection which exists between block 80 and node 82, and the right side of this multiplier connects with the upper-shown input terminal 84a in node 84. The left side of multiplier 88 in FIG. 6 connects with minus (−) input terminal 82b in node 82, and the right side of this multiplier connects with lower input terminal 84b in node 84.

The fixed-value Gamma factors (Gamma 1, Gamma 2, Gamma 3 and Gamma 4) associated with multipliers 86, 88 are always the same within a given single block 70. However, the fixed-value Gamma factors per se have different values depending upon (a) whether block 70 is being created for use in an upper or in a lower section branch, and (b) whether block 70 is to be employed either a Type-I or in a Type-II WDF agency.

In a Type-I agency, the upper branch Gamma factors are all the same (Gamma 1), and preferably have the value ⅛, and the lower branch Gamma factors are also all the same (Gamma 2), and preferably have the value ½+ 1/16. In a Type-II agency, all of the upper branch Gamma factors (Gamma 3) preferably have the same value ¼+ 1/64, and all of the lower branch Gamma factors (Gamma 4) preferably have the same value ½+¼.

An interesting feature of the preferred embodiment of this invention is that the Gamma multipliers represented in FIG. 6 by blocks 86, 88 are implemented, effectively, as hard-coded sums of binary number shifts. All of the actual Gamma multipliers which have this hard-coded characteristic herein are more specifically illustrated as individuals in FIG. 13 of the drawings (still to be discussed) which details the structure of engine 32.

Within the elliptical sections and structures shown in FIGS. 4, 5 and 6, arrowheads on lines indicate signal-flow "directions".

Figures 7, 8:
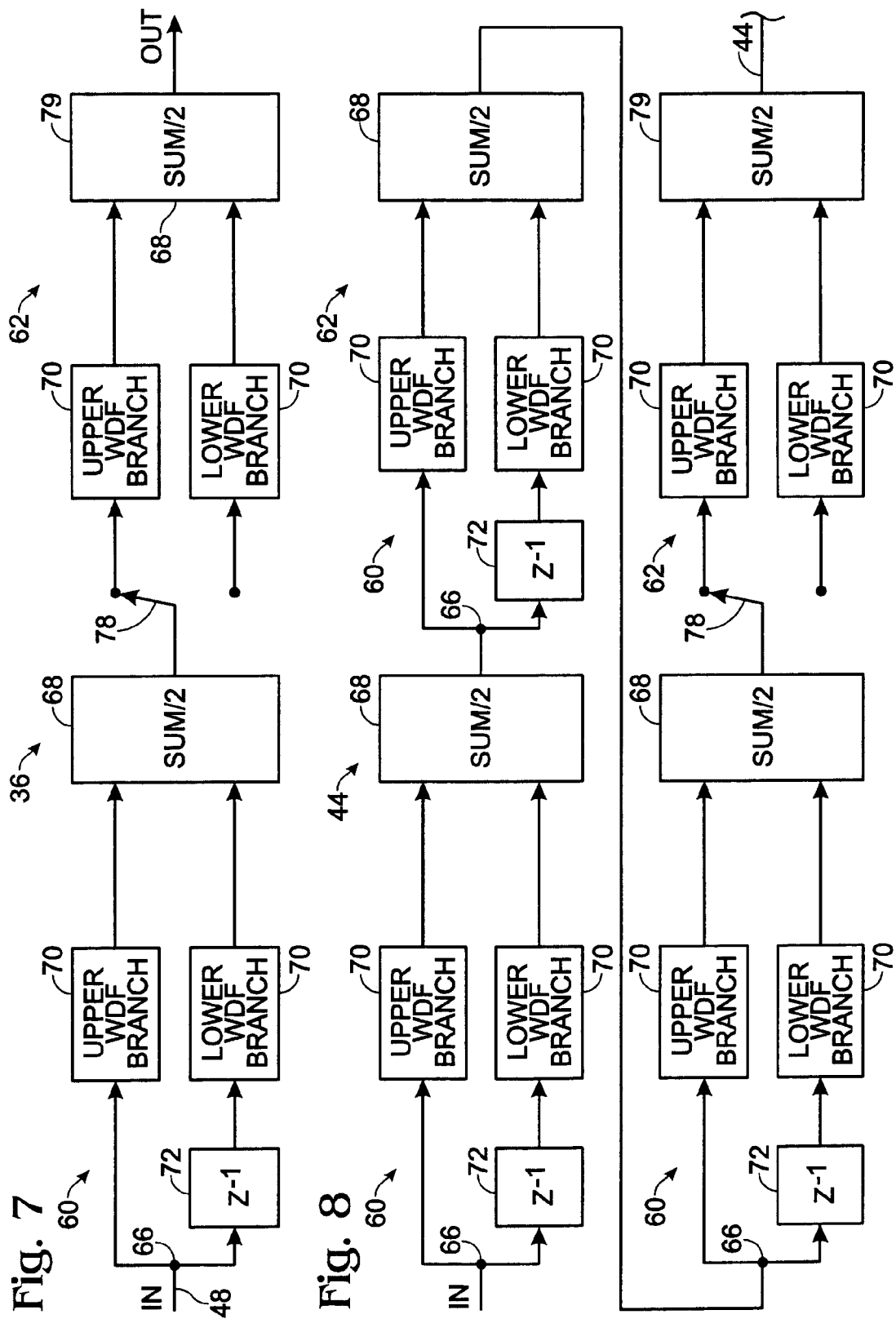
FIG. 7 is a high-level block/schematic diagram of what is referred to herein as a Type-I WDF agency.
FIG. 8 is a high-level block/schematic diagram of what is referred to herein as a Type-II WDF agency.
Figure 9:
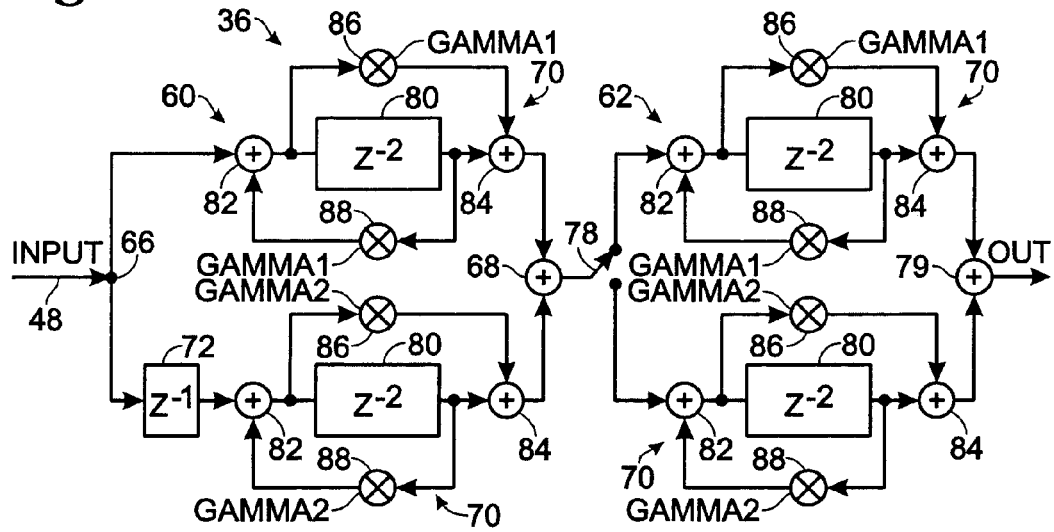
FIG. 9 provides a somewhat more detached view of the Type-I WDF agency pictured in FIG. 7.

FIGS. 7 and 8 picture the constructions of previously mentioned Type-I and Type-II WDF agencies 36, 44, respectively. Specifically, these two figures show how the two, different $5^{th}$-Order elliptical sections presented in FIGS. 4 and 5 are assembled by engine 32 to form agencies 36, 44. What can be seen clearly here is that each Type-I agency is formed as a concatenated series of two different $5^{th}$-Order elliptical sections, including an upstream section, which is a non-decimating section 60, and a decimating, downstream section 62. Each Type-II agency is formed as a concatenated series of four $5^{th}$-Order elliptical sections, including three upstream (or input), non-decimating sections 60 coupled to one downstream, decimating section 62.

From the system description which has now been given above, and looking now especially at FIG. 15, one can see that the entirety of a WDFA, such as a WDFA 46, can be fabricated by the activity of operating engine 32 so as to create a seriatim, time-phased series of upper and lower elliptical-section branches (a) having the correct Gamma multiplier factors defined for them, and (b) including (or not including) a delay element 72. To create a Type-I agency, the engine, utilizing the correct Gamma factors, creates a simple succession including, first, a non-decimating $5^{th}$-Order elliptical section 60, followed by a decimating $5^{th}$-Order elliptical section 62. If more than one Type-I agency is required to process a particular signal, the engine simply repeats this process an appropriate number of times. This total number of times is represented by N in FIG. 15.

To create a Type-II agency, engine 32, again utilizing the correct Gamma factors, generates, first, a series of three non-decimating $5^{th}$-Order elliptical sections 60, followed by the formation of a single, decimating elliptical section 62.

Figure 10:
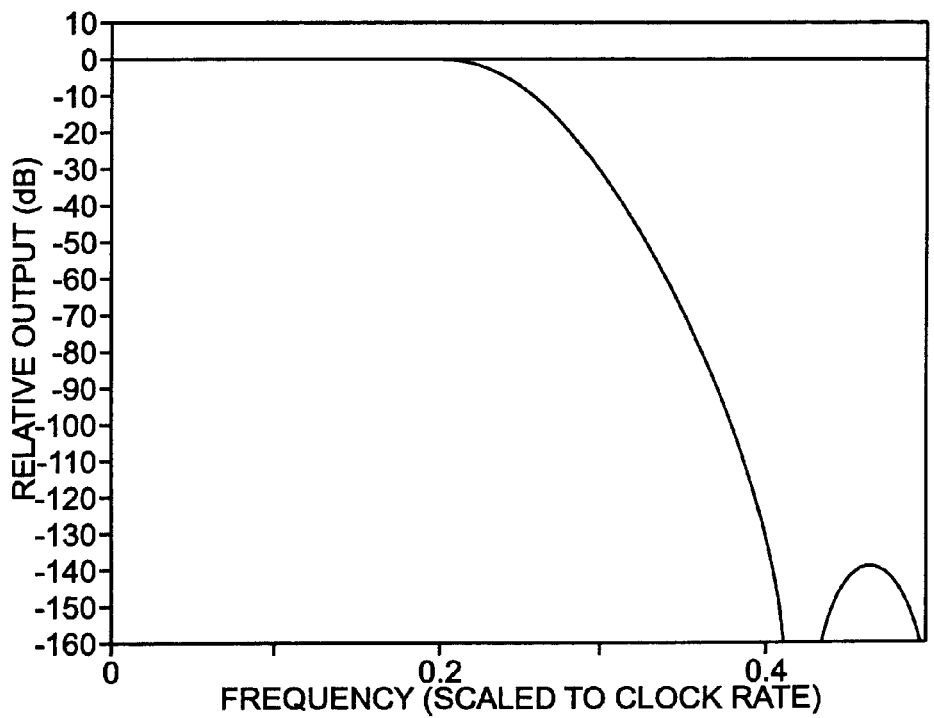
FIG. 10 illustrates the transfer function of the Type-I agency shown in FIGS. 7 and 9.
Figure 11:
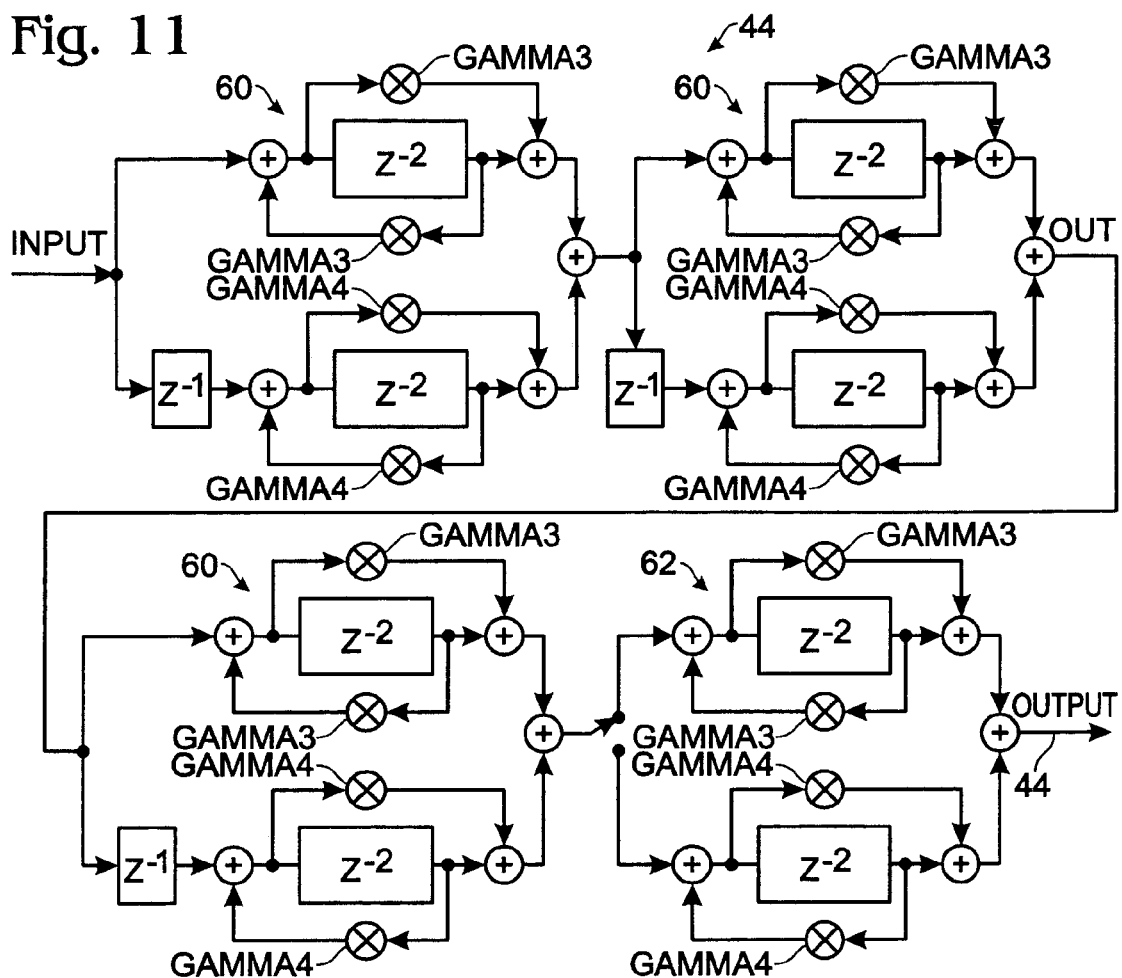
FIG. 11 furnishes a somewhat more detailed view of the Type-II WDF agency shown in FIG. 8.
Figure 12:
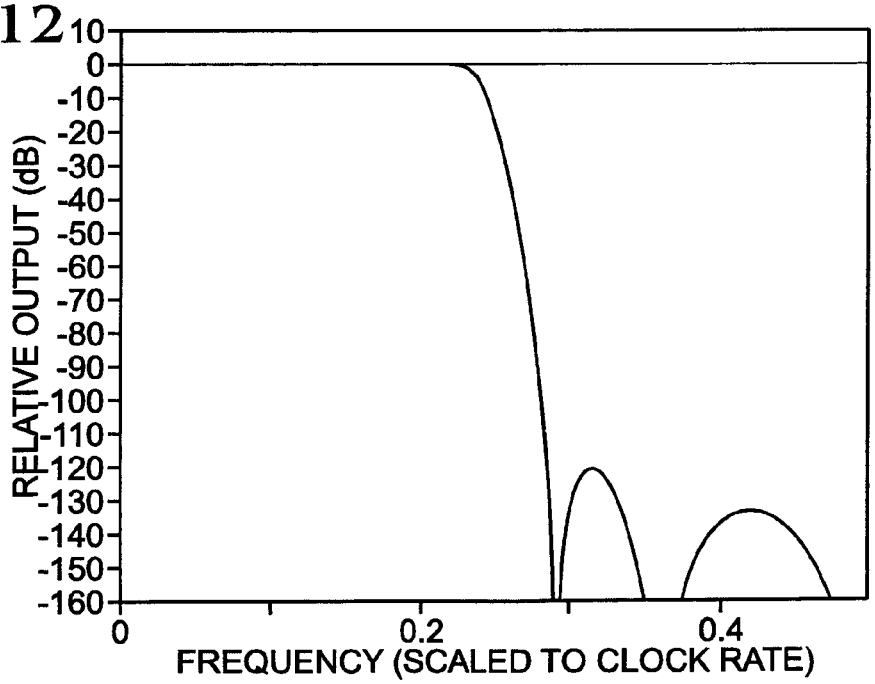
FIG. 12 illustrates the transfer function of the Type-II agency shown in FIGS. 8 and 11.

FIGS. 10, 12, and 3 describe the respective transfer functions and transition bandwidth characteristics of (a) a Type-I WDF agency, like agency 36, (b) a Type-II WDF agency, like agency 44, and (c) a WDFA, like WDFA 46.

Beginning with FIG. 10 which illustrates the transfer function of a Type-I WDF agency, the x-axis represents scaled frequency lying within a range from 0.0 to 0.5. Frequency values are scaled by normalizing the frequency with the appropriate clock rate. The y-axis in this figure represents relative output in decibels (dB). As can be seen from the plotted information in FIG. 10, attenuation of an input signal is approximately 0-dB until the scaled frequency reaches approximately 0.2. Attenuation above this scaled-frequency value increases relatively slowly, following a parabolic path, until it reaches about 120-dB attenuation, where the scaled frequency reaches approximately 0.39. Thus, the transfer frequency range over which a Type-I agency attenuates a signal from 0-dB attenuation to 120-dB attenuation is approximately 0.2 to 0.39 on a scaled-frequency scale. This defines a transfer frequency band which, when normalized to clock rate, is approximately 0.19.

FIG. 12 presents a similar graphical representation of the transfer function of a Type-II WDF agency constructed in accordance with practice of the present invention. Here also the x-axis plot represents scaled frequency lying within a range from 0.0 to 0.5. Again, frequency is scaled by normalizing the frequency with the appropriate clock rate. The y-axis represents relative output in decibels (dB). As can be seen here, attenuation of an input signal is approximately 0-dB until the scaled frequency reaches approximately 0.22. Signal output then decays rapidly, following an exponential pattern, until it reaches 120-dB attenuation, where the scaled-frequency value reaches approximately 0.28. Thus the transfer frequency range over which a Type-II agency attenuates a signal from 0-dB attenuation to 120-dB attenuation is approximately 0.22 to 0.28 on the scaled-frequency scale. This results in the transfer frequency band, normalized to clock rate, being about 0.06. Thus, the Type-II WDF agency proposed by the present inventions furnishes an extremely fast (or short, or steep) transfer function.

FIG. 3 provides a graphical representation of the transfer function provided by a composite (Type-I/Type-II) wave digital filter (WDFA) formed in accordance with practice of the present invention. The x-axis in this figure represents scaled frequency in the range from 0.0 to 0.5. Again, frequency is scaled by normalizing the frequency with the appropriate clock rate. The y-axis expresses relative signal output in decibels (dB). As can be seen here, attenuation of an input signal is approximately 0-dB until the scaled frequency reaches approximately 0.015, beyond which signal output decays rapidly, following a near asymptotic path, until in reaches 120-dB attenuation, where scaled-frequency reaches approximately 0.022. Thus the transfer frequency range over which a WDFA prepared in accordance with the invention attenuates a signal from 0-dB attenuation to 120-dB attenuation is approximately 0.015 to 0.022 on a scaled-frequency scale. This represents a transfer frequency band, normalized to clock rate, of about 0.007.

Figure 13:
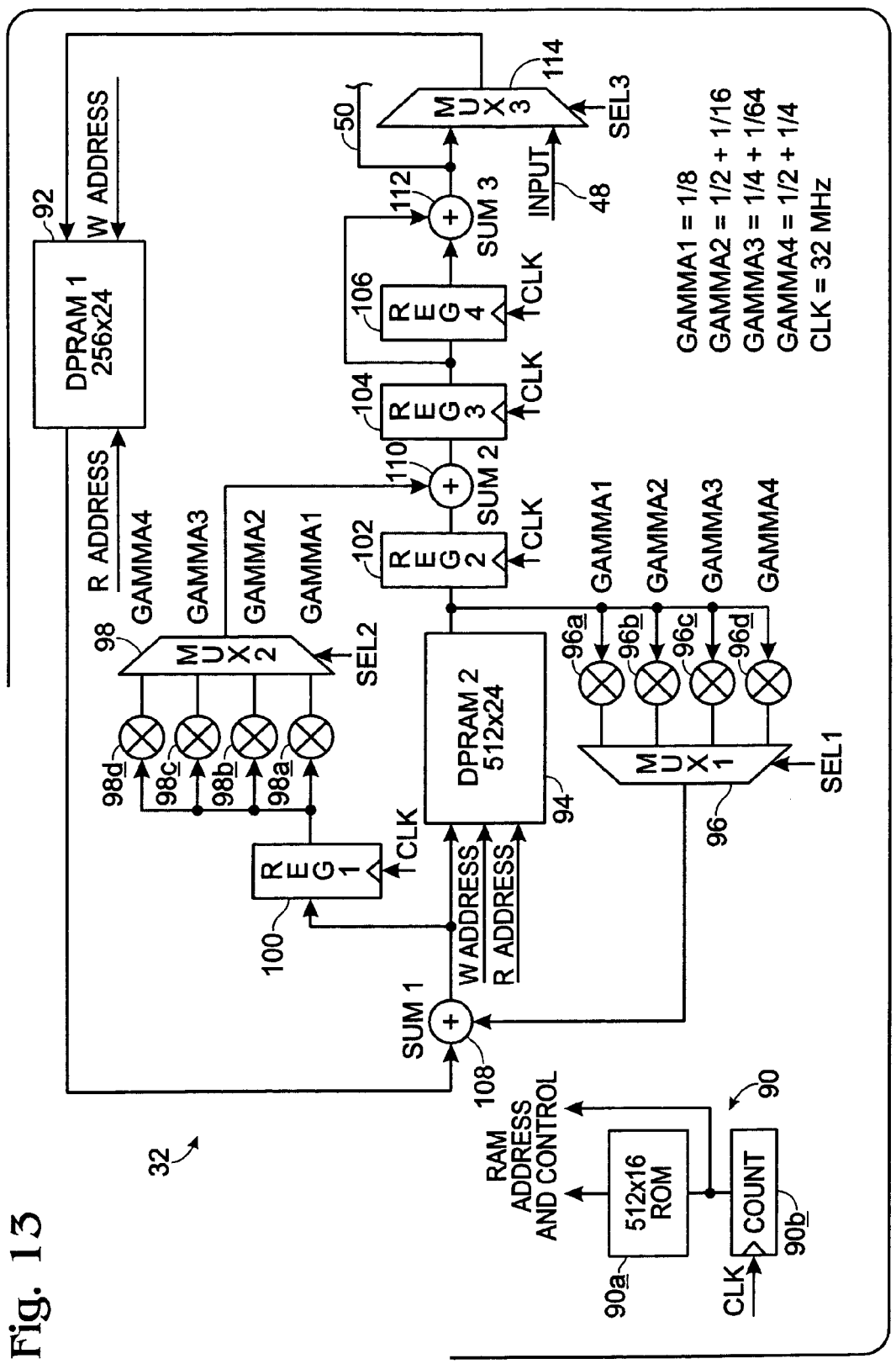
FIG. 13 provides a high-level block/schematic illustration of a time-slice-based, computer-based, digital fabricating engine which operates in accordance with the present invention to instantiate the various functional structures that are presented in FIGS. 4-9, inclusive, and 11.

Completing a description now of the structure and methodology of this invention, the composition and operation of instantiating engine 32 are described. Beginning with FIG. 13, here, engine 32 is shown occupying most of the space of this figure. To the left of engine 32 in FIG. 13 is a memory and counter structure 90 which includes a 512×16 read only memory 90*a* (PROM), and a clock-pulse driven counter 90*b*. Structure 90 functions, with respect to the operation of engine 32, to generate control addresses for each one of a pair of memories, still to be described, which form parts of engine 32. More will be said shortly about structure 90 and its components 90*a*, 90*b* in relation to drawing FIGS. 20-27, inclusive.

Engine 32 includes at 92, 94 (DPRAM 1, DPRAM 2, respectively) these two, just-mentioned memories, a pair of four-input multiplexers 96, 98 (MUX 1, MUX 2, respectively), four registers 100, 102, 104, 106 (Reg 1, Reg 2, Reg3, Reg 4, respectively), three two-input summing nodes, or adders, 108, 110, 112 (SUM 1, SUM 2, SUM 3, respectively), and a two-input multiplexer 114 (MUX 3). Directly associated with the four inputs in multiplexer 96 are four Gamma-factor multipliers 96*a*, 96*b*, 96*c*, 96*d*. Similarly, directly associated with the four inputs in multiplexer 98 are four Gamma-factor multipliers 98*a*, 98*b*, 98*c*, 98*d*. Multipliers 96*a*, 98*a* utilize Gamma 1, multipliers 96*b*, 98*b* Gamma 2, multipliers 96*c*, 98*c* Gamma 3, and multipliers 96*d*, 98*d* Gamma 4. Arrowheads provided on the various interconnecting lines shown in FIG. 13 describe signal-flow directions. Input and output structures 48, 50 are shown connected to multiplexer 114.

As was mentioned earlier, all of these now individually pictured Gamma multipliers are implemented in engine 32 in the forms of hard-coded sums of binary number shifts. The respective "values" of these several multipliers, as set forth above in this text, are directly reflected in these hard-coded "sums" and "shifts". This advantageous approach to effecting "multiplication" produces great simplicity and efficiency in the preferred implementation of the invention.

While different specific implementation approaches may be used for engine 32, the preferred embodiment illustrated herein is implemented in a commercially available FPGA Xilinx XCV50 device. Memory 92 is configured as a 256× 24 dual-port random access unit, and memory 94 as a 512×24 dual-port random access unit.

All control and memory addresses involved in engine operation are generated by and from memory and counter structure 90.

FIG. 13 in the drawings, along with FIGS. 4-9, inclusive, 11, and 15-27, inclusive, are presented herein in manners which will fully equip those skilled in the art to implement and practice this invention.

FIG. 15, as has been mentioned earlier, is a fully explanatory, high-level block representation of the "flow" of the operation of engine 32 during (and focused upon) the creation of a single WDFA, such as WDFA 46. This operation is repeated to create an appropriate plurality of time-successive WDFA functional structures, on a successive channel-by-channel basis, so long as channel input signals are presented for processing.

Figure 19:
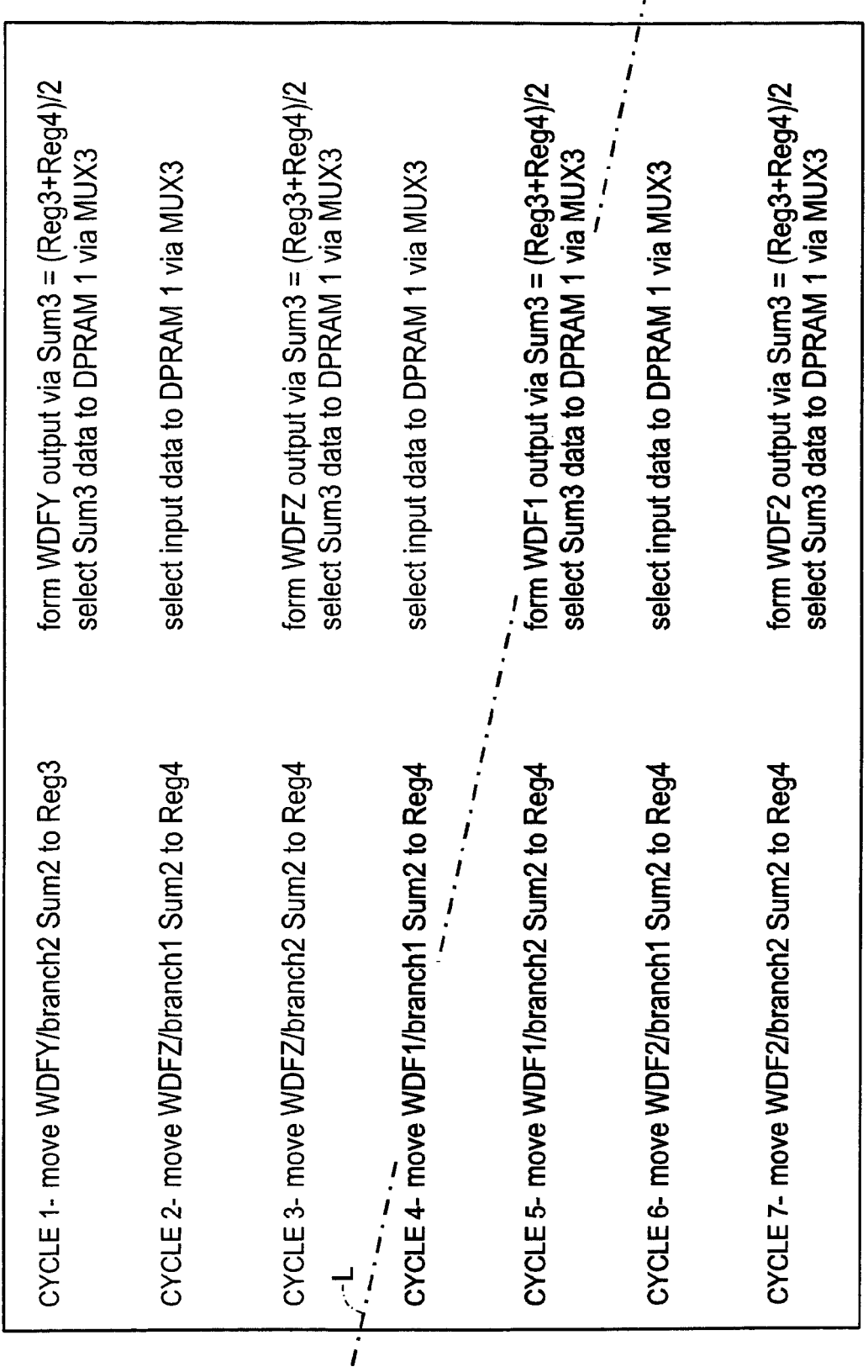
Figure 20:
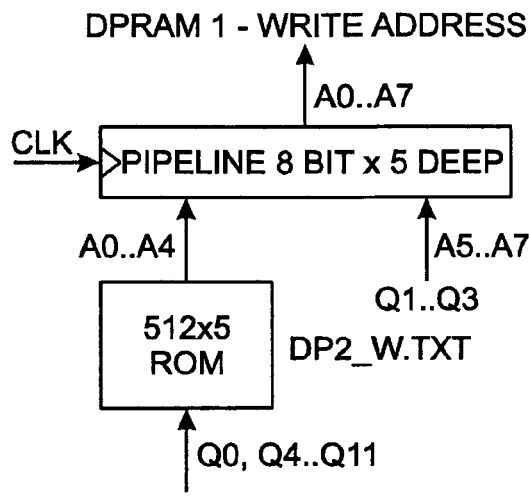
FIGS. 20-24, inclusive, detail, in block/schematic forms, the make-up of a memory and counter structure which is employed in the operation of the fabricating engine of FIG. 13.
Figure 21:
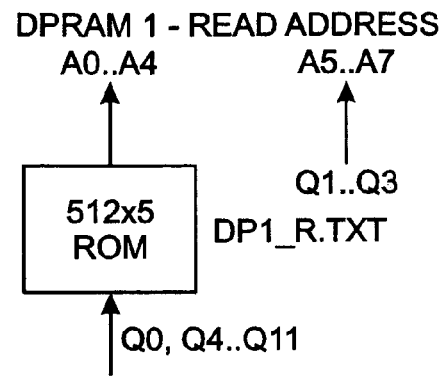
Figure 22:
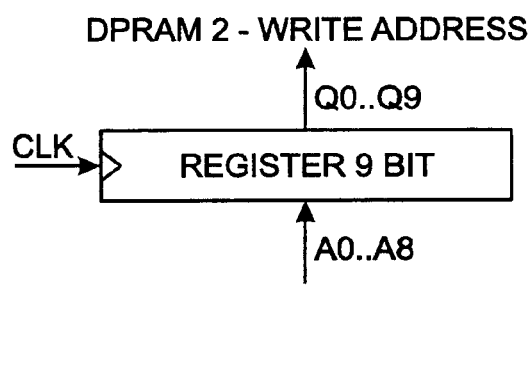
Figure 23:
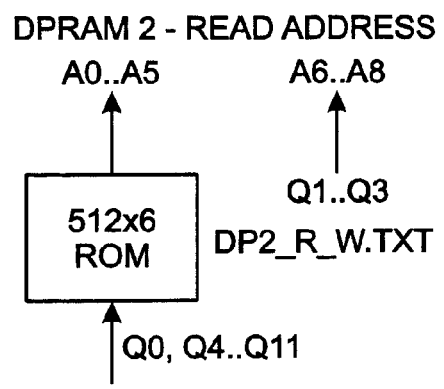
Figure 24:
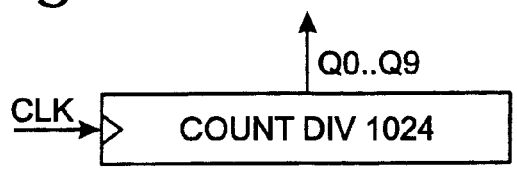

FIG. 16 shows how FIGS. 17-19, inclusive, may be spatially assembled to be read in an integrated fashion. FIGS. 17-19, inclusive, when assembled as pictured in FIG. 16, collectively describe, in detailed, darkened text, various engine-32 operations which typically take place during five successive clock signals. During these five "pictured" clock signals, one can observe, among other things, instantiated assembly by engine 32 of one complete $5^{th}$-Order elliptical section, performed in accordance with preferred practice of the invention. Instantiation of this elliptical section is "readable" from FIGS. 17-19, inclusive, effectively by "reading" downwardly and to the right along the angularly deployed dash-dot line L which can be visualized as being threaded as a continuum through the left-to-right lateral assembly of these three figures as shown by FIG. 16.

Providing now a somewhat more detailed narrative description of the structure and operation of this invention, engine 32 uses a fixed-topology, pipelined, signal-flow architecture to generate an all-pass transfer function (performed by an elliptical-section branch) every clock cycle.

The all-pass transfer function is expressed as follows:

$$H(Z) = \frac{\text{Gamma} + Z^{-2}}{1 + \text{Gamma} \times Z^{-2}} \quad [1]$$

Where Gamma is selected by the micro-code out of the sparse set:

Gamma 1=(⅛)=(0.125)
Gamma 2=(½+ 1/16)=(0.5625)
Gamma 3=(¼+ 1/64)=(0.265625)
Gamma 4=(½+¼)=(0.75)

Also included in the engine is a delay/summation stage that allows two contiguous all-pass section branch outputs to be summed together to calculate a $5^{th}$-Order WDF filter elliptical section of the form:

$$H(Z) = \frac{Gamma1 + Z^{-2}}{1 + Gamma1 \times Z^{-2}} + Z^{-1} \frac{Gamma2 + Z^{-2}}{1 + Gamma2 \times Z^{-2}} \quad [2]$$

Five stages of pipeline registers are used in the signal-flow path of the engine to maintain speed of operation, and a result is that the engine provides an all-pass filter-section branch every clock cycle (or equivalently a $5^{th}$-Order WDF elliptical section every two clock cycles), with a latency of five clock cycles.

Engine 32 is programmed to operate as a multi-channel decimation filter by correctly sequencing the read/write addresses that are used to provide the register banks for the filter sections. These addresses are pre-calculated, and are stored appropriately in a small PROM (90a) look-up table.

The basic operation of the engine is now described on a cycle-by-cycle basis, under circumstances with the engine generating a single WDF $5^{th}$-Order elliptical filter section. In this context, one should note that the two dual-port RAM memories 92, 94 (DPRAM 1, DPRAM 2, respectively) in the engine have completely independent read and write ports. As a consequence, reading and writing from different RAM locations can be carried out simultaneously in the same clock cycle.

The RAM addresses are organized so that (a) two contiguous samples of the required filter channel time series are processed sequentially, and (b) the WDF filter transform functions for that channel are generated properly. Data from a different filter channel or for a different decimation stage of the same channel can then be processed in the next-following, two time slots. The related engine-32 operation is basically as follows:

DPRAM 1 (92), MUX 1 (96) and SUM 1 (108) are used to form the recursive part of the transfer function detailed in equation [1] above, i.e., they calculate:

$$H(Z) = \frac{1}{1 + Gamma \times Z^{-2}} \quad [3]$$

Thus, during clock cycle 1:
(a) Input data is read from DPRAM 1 (92);
(b) $Z^{-2}$ registered data is read from DPRAM 2 (94) and scaled by the Gamma weighting (multiplication) selected via MUX 1 (96); and
(c) The MUX 1 (96) output and the $Z^{-2}$ DPRAM 1 (92) outputs are added together in SUM 1 (108) to form the all-pass filter output to generate the transfer function given in equation [3] above.

The output from SUM 1 (108) and from DPRAM 2 (94) are registered into pipeline registers Reg 1 (100) and Reg 2 (102), respectively, ready to form the numerator part of equation [1] using MUX 2 (98) and SUM 2 (110), i.e. to calculate:

$$H(Z) = Gamma + Z^{-2} \quad [4]$$

During clock cycle 2:
(a) The recursive-section output generated from SUM 1 (108) in cycle 1 is written back into DPRAM 2 (94) to provide for delayed data needed for later calculations;
(b) Data is registered into Reg 1 (100) and Reg 2 (102);
(c) Reg 1 (100) data is scaled by the Gamma weighting (multiplication) selected via MUX 2 (98) and added to the registered DPRAM 2 (94) output from Reg 2 (102) to generate equation [4], so the overall transfer function generated thus far through the processing is given in equation [1] above; and
(d) At the same time, DPRAM 1 (92), MUX 1 (96) and SUM 1 (108) form another sample of the all-pass filtered data, using different data samples of the same input channel time series data.

The output from SUM 2 is loaded into pipeline register Reg 3 (104) during clock cycle 3, and into Reg 4 (106) in clock cycle 4. Because of the pipelined nature of the engine and the continuous processing cycles being calculated by that engine, at the end of clock cycle 4, there exist two time-contiguous samples of the required all-pass filter functions stored in Reg 3 (104) and Reg 4 (106). When added together by SUM 3 (112), these form the required $5^{th}$-Order WDF transfer function (elliptical section) defined in equation [2]. The output of SUM 3 (112) is scaled by 0.5 (by a hard-coded shift) to avoid excessive word-length growth through the various processing activities.

The scaled SUM 3 (112) output, selected via MUX 3 (114) is written back into DPRAM 1 (92) during clock cycle 5 so that this data can be re-cycled through the engine to cascade filter sections, and to allow further decimation. Because SUM 3 (112) provides valid filter output data only on alternate cycles, every other cycle is available for MUX 3 (114) to select input data to update DPRAM 1 (92). Hence DPRAM 1 (92) is used to store both the unprocessed input data, as well as partially processed data to be used for further filter/decimation processing.

The basic operation of the WDF engine thus provides a succession of all-pass filter sections, and, as described above, decimation filtering normally works by using two all-pass sections performed sequentially on each channel to implement a $5^{th}$-Order WDF elliptical filter section.

According to practice of the present invention, and as has been mentioned, two types of WDF filters (the Type-I and Type-II agencies described above) are needed for high-performance decimation. The Type-I agency, with a moderate transition bandwidth and a minus 120-dB stop-band attenuation, uses a cascade of two $5^{th}$-Order elliptical sections. The Type-II agency, with sharper transition bandwidth and, again, a minus 120-dB stop-band, uses a cascade of four $5^{th}$-Order elliptical sections.

The input data rate to engine 32 needs to support samples from eight data-acquisition channels, each sampled at 500-kHz, giving an available time slot of 250-nSecs per channel. For a 32-mHz WDF engine clock rate, this allows eight clock cycles per channel for processing.

In order for processing to take place appropriately under these circumstances, it is necessary to provide a Type-I agency on each channel at the input data rate, the output of which is decimated by a factor of two. This first Type-I agency requires two $5^{th}$-Order elliptical sections, and so uses up four of the eight clock cycles, leaving four cycles for further filtering. If one were simply to cascade multiple, decimate-by-two, Type-I agencies, then, because each Type-I agency decimates the sample rate by a factor of two, one could continue cascading decimation filters within the mentioned, remaining, four-clock-cycle slot ad infinitum.

Initially with the un-decimated input data, the illustration now being described provides eight clock cycles in total which are available per channel for processing. After the first stage of decimation by two, four of the eight available cycles have been used-up. However, since the output data rate is now reduced by a factor of two, there is actually a total of sixteen clock cycles per output sample available in the processing sequence, of which eight are unused.

If one decimates by a further factor of two, there exists a total of thirty-two clock cycles per output sample available in the processing sequence, again, eight of which are unused. Thus, one can continue cascading decimate-by-two sections, and after D decimations, will always have eight free clock cycles in the sequence length defined by the decimated output sampling rate for the (D+1)$^{th}$ decimation.

Accordingly, one has available essentially a geometric sum for the number of clock cycles per channel slot needed overall having the form:

$$N = 4 + \sum_{d=1}^{D} 4/2^d \qquad [5]$$

Where N=number of clock cycles per time slot, and
D=total number of Type-I decimate-by-two agencies.

In the limit, as D approaches infinity, N approaches eight. Thus, eight clock cycles per channel allows one essentially to cascade Type-I agencies forever.

In practice, it seems most appropriate to filter/decimate signals down to around a 16-kHz sample rate, and thus require a total decimation of x32. The final stage of decimation needs to be performed with a Type-II agency to provide a sufficiently steep transition bandwidth, and this is furnished by providing a cascade of four Type-I agencies, followed by a Type-II agency. After the first four Type-I decimations, there are eight clock cycles remaining. These remaining cycles are used to calculate the cascade of four 5$^{th}$-Order elliptical sections required for the Type-II final filter stage.

Consequently, the micro-code sequence length for a complete decimate-by-32 system, using four Type-I WDF agencies followed by a final Type-II agency requires 32×8 cycles per channel, requires 256-states per channel Each 5$^{th}$-Order elliptical section requires two RAM locations for intermediate data storage, and so, a total of sixteen locations is needed for the Type-I agencies required per channel, plus a further four for the final Type-II agency—a grand total of twenty locations per channel. Hence the size required for the DPRAM 2 memory for eight channels of signal data is 192-locations. To simplify addressing, the DPRAM size would normally by rounded up to the nearest convenient 'whole binary number', i.e. to 256-locations. Similarly, each 5$^{th}$-Order elliptical section needs one RAM location for storage in DPRAM 1, thus giving a required DPRAM size of 128-locations.

As was mentioned previously, engine 32 uses a fixed topology, and is essentially programmed by controlling the two DPRAM read/write address sequences. The DPRAM addresses are pre-calculated for the number of channels and the decimation sequencing required, and the resultant address sequences are stored in PROM 90a. The "regional sizes" within PROM 90a that are appropriately made available in the particular system described herein are 512×6 for DPRAM 2 read/write addresses, and two of the size 512×5 for DPRAM 1 read and write addresses.

One should note that the same address information can be used for read and write addressing for DPRAM 2, since the recursive part of the all-pass elliptical section operates on a read/modify/write cycle, and only one effective register is needed for each all-pass through-path. However, because of the pipeline delay of one cycle in calculating this recursion, the write address must also be delayed to compensate.

For DPRAM 1, separate read and write address sequences are needed, and so, separate addressing PROM sites in PROM 90a are needed. The sites are sequenced using a straight binary counter (90b), driven by the 32-mHz system clock. Because the same processing operations are required on eight data channels in the system illustrated herein, the DPRAM addresses are broken essentially into two fields—(1) a channel-address field (the three Most Significant Bits (MSBs) of the address), driven straight from the sequence binary counter (90b), and (2) a "register" field (the remaining bits), driven with PROM data. The basic topology for these address generation systems is shown schematically and tabularly in FIGS. 20-27, inclusive.

Turning particular attention now to these several drawing figures, these figures effectively illustrate the important sequential addressing activities which take place during operation of engine 32. FIGS. 20-24, inclusive give schematic structural/functional views of these activities, and FIGS. 25-27, inclusive, illustrate specific RAM address sequencing—one figure each for DPRAM 1 WRITE ADDRESS sequencing (FIG. 25), DPRAM 1 READ ADDRESS sequencing (FIG. 26), and DPRAM 2 WRITE-READ ADDRESS sequencing (FIG. 27). These latter three figures show the actual addresses supplied to these RAM structures in a length-512 sequence, and thus illustrate composites of ROM output and sequential count, as depicted in FIGS. 20-24, inclusive.

The following text describes how to read each of FIGS. 25, 26 and 27. In the left-most column (thirty-two rows long) of four digits, the first three digits in each row in this column are the MSBs of an address, and the fourth digit in this column, in all cases a 0, can be thought of as being a "placeholder" for the "insertion" of a series of fourth, Least-Significant-Bit (LSB) digits which complete a four-digit address. Thus this "three-plus-one" pattern forms a two-dimensional depiction of a length-512 sequence. The 512 locations so accessed are, therefore, 0000 to 01F0, or 0 to 511. The main block/matrix of numbers, any member of which is identified by the coincidence of any four-digit row designator (0000-01F0), and any column digit (0-F), is the address value presented to one of the DPRAMs for that point in an operating sequence.

Using DPRAM 1 READ ADDRESS (FIG. 26) as an example, the first row immediately below the above-mentioned upper-most row is read as 0000, with a content (the address supplied to DPRAM 1) of 0; the next address is 0001, with a content of 1; and so on up to, at the end of the first row, the address 000F, with a content of B (decimal 11, or pure binary 1011).

One can thus see that the matrix of numbers for each DPRAM READ or WRITE sequence (FIGS. 25-27, inclusive), is therefore a two-dimensional representation of a complete eight-channel processing sequence of length 512.

Accordingly, a preferred and best mode embodiment of, and manner of practicing, the invention are thus described. The invention, as stated earlier, offers a number of significant advances in the field of digital signal processing, and does so through presenting this field with several unique practices and resulting structures. Introduced by the invention is a novel digital-instantiating fabricating engine which operates, inter alia, to generate in time sliced manners, a new, fundamental, all-pass branch for the construction, ultimately, of a new 5$^{th}$-Order elliptical WDF section, which, in turn, is employed by the engine to generate a new Type-II WDF agency possessing a notably "steep and fast"

transition-bandwidth characteristic. Also proposed by the invention, instantiated preferably by the engine of the invention, is a new composite Type-I/Type-II wave digital filter formed as a concatenation of decimating and non-decimating $5^{th}$-Order elliptical sections organized into the composite structure. This concatenation, combining, as it does, the cooperating transition bandwidths of a Type-I and the new Type-II agencies, offers an extremely short and fast collaborative transition-bandwidth performance. Each composite structure includes at least one (but may include many) "initial" Type-I agency(ies), depending upon the number of "pre-Type-II" decimations which are desired, and but a single, final Type-II agency.

The structure and practice of the invention can easily accommodate multiple input channels of signals for processing, and in conjunction with performing processing efficiently and effectively, employs simple hard-coded binary "sums and shifts", the Gamma factors described herein, to perform "multiplications".

Accordingly, while preferred structures and practice modalities are specifically described and illustrated herein to disclose the various facets of this invention, we appreciate, as will those generally skilled in the relevant art, that variations and modifications thereof may be made without departing from the spirit of the invention.

We claim:

1. Digital signal-processing structure in the form of programmed hardware comprising
   a Type-II wave digital filter (WDF) agency taking the form of a concatenated series of four $5^{th}$-Order elliptical sections, including three, upstream input sections which are non-decimating sections, and a single, downstream output section which is a decimating section, said agency having input and output sides operatively coupled to said input and output sections, respectively, and
   signal input and output structures operatively connected, respectively, to said input and output sides.

2. The structure of claim 1 which further includes a time-slice-based, digital fabricating engine, and said Type-II agency is an instantiated fabrication product of said engine.

3. The structure of claim 2, wherein each of said sections is structurally characterized, at least in part, by fixed-value Gamma multiplication factors.

4. The structure of claim 2, wherein said WDF agency is, as a whole, effectively a decimate-by-two agency.

5. The structure of claim 1, wherein each of said sections is structurally characterized, at least in part, by fixed-value Gamma multiplication factors.

6. The structure of claim 1, wherein said WDF agency is, as a whole, effectively a decimate-by-two agency.

7. The structure of claim 1, wherein each of said sections is alike in the sense of being characterized by a pair of parallel branches, each of which branches is characterized by a single, fixed-value Gamma multiplication factor.

8. The structure of claim 7, wherein, with respect to the two branches in a section, the characterizing Gamma multiplication factors are different.

9. The structure of claim 7, wherein said branches in said non-decimating sections differ, at least in part, by the presence in one only of these branches of a delay element.

10. The structure of claim 9, wherein, with respect to the two branches in each said non-decimating section, the characterizing Gamma multiplication factors are different.

11. The structure of claim 1, wherein each of said non-decimating sections is characterized by a pair of parallel branches which differ, at least in part, by the presence in one only of these branches of a delay element.

12. The structure of claim 1, wherein said decimating and non-decimating sections differ, at least in part, by the presence in said decimating sections of two selectable, mutually exclusive through-paths.

13. The structure of claim 1, wherein said signal input structure includes at least one Type-I wave digital filter (WDF) agency taking the form of a concatenated series of two $5^{th}$-Order elliptical sections, the first of which is an upstream, non-decimating section, and the second of which is a downstream, decimating section, said at least one Type-I agency and said Type-II agency collectively forming a composite WDF.

14. The structure of claim 13 which further includes a time-slice-based digital fabricating engine, and said Type-I and Type-II agencies are instantiated fabrication products of said engine.

15. The structure of claim 14 which is disposed in a setting, wherein (a) said Type-I agency is connected to the output side of a plural-channel signal feed structure by way of which, on a per channel basis, signals to be processed are fed initially to said Type-I agency, and (b) the performance of said engine is such that, for each signal fed for processing from each channel, the engine fabricates a time-sliced and phased, associated composite WDF.

16. The structure of claim 1 which further includes
   a time-slice-based digital fabricating engine, and
   software operating structure operatively associated with said engine, structured to operate the engine in a time-slice-based fabrication mode wherein the engine, in a time-differentiated and instantiating manner, functions to fabricate a time-succession of individual, composite wave digital filters.

17. The structure of claim 1 which further includes
   a time-slice-based fabricating engine operable over an extent of time, and during a defined span within such a time extent, to fabricate/realize, as an integral structural and functional portion of itself,
   a pair of signal input and output zones, and
   interposed said zones, at least one time-slice-instantiated wave digital filter assembly (WDFA) which is structured to intake and process a signal presented to said input zone, and to furnish to said output zone a WDFA-processed version of such an in-taken signal.

18. The structure of claim 17, wherein said engine, over and within such a time extent, is operable to fabricate/realize a plurality of time-successive, differentiated WFDAs.

19. Digital signal-processing structure in the form of programmed hardware comprising
   a plurality of early-stage, decimate-by-two, signal-processing agencies connected in a cascade series arrangement, said agencies each being associated with a first transfer function having a first transition bandwidth, and each having an output, and
   a later-stage, decimate-by-two, signal-processing agency selectively coupleable to different ones of said outputs, said later-stage agency being associated with a second transfer function having a transition bandwidth which is less than said first transition bandwidth.

20. The structure of claim 19, wherein said second transition bandwidth is steeper than said first transition bandwidth.

21. The structure of claim 19, wherein said later-stage agency takes the form of Type-II, decimate-by-two, wave digital filter (WDF) agency which includes an effective concatenation of three, non-decimating, 5th-Order elliptical sections followed by a single, decimating, $5^{th}$-Order elliptical section.

22. The structure of claim 21, wherein each of said plurality of early-stage agencies takes the form of a Type-I, decimate-by-two, WDF agency which includes an effective concatenation of a single, non-decimating, $5^{th}$-Order elliptical section followed by a single, decimating, 5th-Order elliptical section.

23. Digital signal-processing structure comprising,
a time-slice-based digital fabricating engine, and
software operating structure operatively associated with said engine, structured to operate the engine in a time-slice-based fabrication mode wherein the engine, in a time-differentiated and instantiating manner, functions to fabricate a time-succession of individual, composite wave digital filters, wherein each of said fabricated filters takes the form of a cascade series arrangement including an upstream, Type-I, decimate-by-two, wave digital filter (WDF) agency, which includes an effective concatenation of a single, non-decimating, $5^{th}$-Order elliptical section followed by a single, decimating, 5th-Order elliptical section, having an output side connected to an input side in a downstream, Type II, decimate-by-two, WDF agency, which includes an effective concatenation of three, non-decimating, 5th-Order elliptical sections followed by a single, decimating, $5^{th}$-Order elliptical section.

24. Digital signal-processing structure comprising,
a time-slice-based digital fabricating engine, and
software operating structure operatively associated with said engine, structured to operate the engine in a time-slice-based fabrication mode wherein the engine, in a time-differentiated and instantiating manner, functions to fabricate a time-succession of individual, composite wave digital filters, wherein each of said fabricated, composite wave digital filters takes the form of a cascade series arrangement including an upstream plurality of cascade-series-connected, Type-I, decimate-by-two, wave digital filter (WDF) agencies, each of which includes an effective concatenation of a single, non-decimating, $5^{th}$-Order elliptical section followed by a single, decimating, 5th-Order elliptical section, collectively having an output region, and a downstream, Type-II decimate-by-two, WDF agency, which includes an effective concatenation of three, non-decimating, 5th-Order elliptical sections followed by a single, decimating, $5^{th}$-Order elliptical section, having an input side operatively connected to said output region.

25. Digital signal-processing structure comprising
a time-slice-based fabricating engine operable over an extent of time, and during a defined span within such a time extent, to fabricate/realize, as an integral structural and functional portion of itself,
a pair of signal input and output zones, and
interposed said zones, at least one time-slice-instantiated wave digital filter assembly (WDFA) which is structured to intake and process a signal presented to said input zone, and to furnish to said output zone a WDFA-processed version of such an in-taken signal, and wherein said WDFA comprises a Type-I wave digital filter (WDF) agency which includes an effective concatenation of a single, non-decimating, $5^{th}$-Order elliptical section followed by a single, decimating, 5th-Order elliptical section.

26. Digital signal-processing structure comprising
a time-slice-based fabricating engine operable over an extent of time, and during a defined span within such a time extent, to fabricate/realize, as an integral structural and functional portion of itself,
a pair of signal input and output zones, and
interposed said zones, at least one time-slice-instantiated wave digital filter assembly (WDFA) which is structured to intake and process a signal presented to said input zone, and to furnish to said output zone a WDFA-processed version of such an in-taken signal, and wherein said WDFA comprises a Type-II wave digital filter (WDF) agency, which includes an effective concatenation of three, non-decimating, 5th-Order elliptical sections followed by a single, decimating, $5^{th}$-Order elliptical section.

27. Digital signal-processing structure comprising
a time-slice-based fabricating engine operable over an extent of time, and during a defined span within such a time extent, to fabricate/realize, as an integral structural and functional portion of itself,
a pair of signal input and output zones, and
interposed said zones, at least one time-slice-instantiated wave digital filter assembly (WDFA) which is structured to intake and process a signal presented to said input zone, and to furnish to said output zone a WDFA-processed version of such an in-taken signal, and wherein said WDFA comprises a composite Type-I and Type-II wave digital filter (WDF) agency arrangement in which the Type-I agency, each of which includes an effective concatenation of a single, non-decimating, $5^{th}$-Order elliptical section followed by a single, decimating, $5^{th}$-Order elliptical section, is disposed upstream relative to the Type-II agency, which includes an effective concatenation of three, non-decimating, 5th-Order elliptical sections followed by a single, decimating, $5^{th}$-Order elliptical section.

28. A digital signal-processing method comprising
providing a time-slice-based digital fabricating engine,
utilizing that engine, instantiating in time-spaced phases wave digital filter (WDF) structure, and
during said instantiating, feeding a signal through, and processing that signal by, such phase-instantiated WDF structure, and wherein said instantiating includes phased fabricating of a Type-II WDF agency which includes an effective concatenation of three, non-decimating, 5th-Order elliptical sections followed by a single, decimating, $5^{th}$-Order elliptical section.

29. A digital signal-processing method comprising
providing a time-slice-based digital fabricating engine,
utilizing that engine, instantiating in time-spaced phases wave digital filter (WDF) structure, and
during said instantiating, feeding a signal through, and processing that signal by, such phase-instantiated WDF structure, and wherein said instantiating includes phased fabricating of a Type-I WDF agency which includes an effective concatenation of a single, non-decimating, $5^{th}$-Order elliptical section followed by a single, decimating, 5th-Order elliptical section.

30. A digital signal-processing method comprising
providing a time-slice-based digital fabricating engine,
utilizing that engine, instantiating in time-spaced phases wave digital filter (WDF) structure, and
during said instantiating, feeding a signal through, and processing that signal by, such phase-instantiated WDF structure, and wherein said instantiating, from the point of view of a signal being processed in accordance with the method, includes, first, phased fabricating of a Type-I WDF agency which includes an effective concatenation of a single, non-decimating, $5^{th}$-Order elliptical section followed by a single, decimating, 5th-Order elliptical section, and second, phased fabricating of a Type-II WDF agency which includes an effective concatenation of three, non-decimating, 5th-Order elliptical sections followed by a single, decimating, $5^{th}$-Order elliptical section.

* * * * *

UNITED STATES PATENT AND TRADEMARK OFFICE
CERTIFICATE OF CORRECTION

PATENT NO. : 7,363,334 B2
APPLICATION NO. : 10/651233
DATED : April 22, 2008
INVENTOR(S) : Curtis et al.

It is certified that error appears in the above-identified patent and that said Letters Patent is hereby corrected as shown below:

Title Page, Item (73) Assignee: should read:

Acoustic Precessing Technology, Inc.

Signed and Sealed this

Eighth Day of July, 2008

JON W. DUDAS
*Director of the United States Patent and Trademark Office*

UNITED STATES PATENT AND TRADEMARK OFFICE
CERTIFICATE OF CORRECTION

PATENT NO. : 7,363,334 B2  Page 1 of 1
APPLICATION NO. : 10/651233
DATED : April 22, 2008
INVENTOR(S) : Curtis et al.

It is certified that error appears in the above-identified patent and that said Letters Patent is hereby corrected as shown below:

Title Page, Item (73) Assignee: should read:

Acoustic Processing Technology, Inc.

This certificate supersedes the Certificate of Correction issued July 8, 2009.

Signed and Sealed this

First Day of September, 2009

David J. Kappos
*Director of the United States Patent and Trademark Office*